(12) United States Patent
Lewis

(10) Patent No.: US 7,088,136 B1
(45) Date of Patent: Aug. 8, 2006

(54) PROGRAMMABLE LOGIC DEVICE LATCH CIRCUITS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 201 days.

(21) Appl. No.: 10/702,999

(22) Filed: Nov. 6, 2003

(51) Int. Cl.
*H03K 19/173* (2006.01)
*G06F 7/38* (2006.01)

(52) U.S. Cl. .............................. 326/46; 326/38; 326/40

(58) Field of Classification Search ................... 326/38, 326/39, 40, 41, 46
See application file for complete search history.

(56) References Cited

U.S. PATENT DOCUMENTS

| | | | |
|---|---|---|---|
| 4,864,161 A | | 9/1989 | Norman et al. |
| 5,258,668 A | * | 11/1993 | Cliff et al. ...................... 326/41 |
| 6,184,707 B1 | * | 2/2001 | Norman et al. ................ 326/39 |
| 6,577,157 B1 | * | 6/2003 | Cheung et al. ................ 326/38 |
| 6,686,769 B1 | * | 2/2004 | Nguyen et al. ................ 326/46 |
| 6,731,137 B1 | * | 5/2004 | Rangan et al. ................. 326/86 |

OTHER PUBLICATIONS

"EPM5016 to EPM5192 High-Speed, High-Density MAX EPLDs" Data Sheet of Altera Corporation, Oct. 1990, ver. 1, pp. 115-121.

* cited by examiner

*Primary Examiner*—Daniel D. Chang
(74) *Attorney, Agent, or Firm*—G. Victor Treyz

(57) ABSTRACT

Latch circuitry is provided for programmable logic regions on integrated circuits such as programmable logic device integrated circuits. A programmable logic device may have programmable logic regions based on programmable combinational logic circuits. Latch circuitry in a logic region may be provided between an output of a programmable combinational logic circuit in the logic region and an output of the logic region. When the latch circuitry is enabled, the latch circuitry performs the functions of a level-sensitive latch. When the latch circuitry is disabled, the latch circuitry acts as a passive data path. The passive data path may include only a single driver so that the latch circuitry adds essentially zero additional delay to the data produced by the combinational logic.

17 Claims, 20 Drawing Sheets

PROGRAMMABLE LOGIC DEVICE LATCH CIRCUITS

BACKGROUND OF THE INVENTION

This invention relates to programmable logic device integrated circuits, and more particularly, to latch circuits for programmable logic devices.

Integrated circuits typically contain combinational logic and sequential logic. Combinational logic does not include storage elements. The output of a given combinational logic circuit is therefore determined solely by its present inputs. Sequential logic circuits contain storage elements that reflect their past behavior. As a result, the output of a sequential circuit is determined by both its present inputs and by the data stored in its storage elements.

Commonly-used sequential circuit storage elements include level-sensitive latches and flip-flops.

In a level-sensitive latch, the latch output is controlled by the level of a clock (enable) input. When the clock is high, the latch output tracks the value of the input. When the clock transitions from high to low, the output state of the latch is frozen at whatever value was present just prior to the transition. So long as the clock is low, the output of the latch will be maintained in its frozen state.

Flip-flops are edge-triggered devices that change state on the rising or falling edge of an enable signal such as a clock. In a rising-edge-triggered flip-flop, the flip-flop samples its input state only at the rising edge of the clock. This sampled value is then maintained until the next rising edge of the clock.

Flip-flop-based logic circuits are often preferred over latch-based circuits, because the regularity imposed by the edge-triggered properties of flip-flops makes circuit timing behavior relatively straightforward to model.

However, latch-based circuits can offer performance improvements over flip-flop-based circuits. In a flip-flop-based logic circuit, the clock frequency must generally be slowed down sufficiently to accommodate the delay associated with the circuit's slowest combinational logic paths. Even if circuitry in a fast logic path produces a valid signal in less time than a slow logic path, that signal is not used until the edge of the next clock pulse. While this regularity is beneficial for ease of circuit design, it tends to limit performance in certain situations.

In latch-based circuits, the time allocated for each combinational logic stage need not be identical. In certain paths, where the delay is small, the ability of the output of a latch to immediately track its input without waiting for the next clock edge can be exploited to gain extra time. The extra time gathered from such logic paths can be shared with other paths. This approach allows slow paths to borrow time from faster paths, so the clock speed for the entire circuit need not be slowed to accommodate worst-case delays.

Because of these attributes, latch-based architectures are sometimes used in high-performance integrated circuits where performance is more important than ease of design.

Programmable logic device integrated circuits are a type of integrated circuit in which a user can configure logic to perform a desired custom logic function. Programmable logic circuits generally use flip-flop-based logic architectures.

It would be desirable to be able to use latch-based circuit arrangements in programmable logic device integrated circuits.

SUMMARY OF THE INVENTION

In accordance with the present invention, latch circuitry is provided for integrated circuits such as programmable logic device integrated circuits. The latch circuitry may be used to implement a zero-delay latch in which latching functions are provided without incurring significant delay penalties.

The latch circuitry may be used on a programmable logic device having programmable logic regions based on programmable combinational logic. The programmable combinational logic may be, for example, look-up-table logic. The combinational logic may have a combinational logic data output line for providing output data. In a given programmable logic region, the output data from the combinational logic data output line associated with that region may be provided to an output line for that programmable logic region. The output line may be connected to interconnection resources on the programmable logic device that feed the output data from the logic region back into the logic region, that convey the output data to input-output circuitry, or that route the output data to other circuitry on the programmable logic device (e.g., other logic regions).

An output driver may be used to drive the data from the combinational logic output line onto the programmable logic region output line. When the latch circuitry is disabled, output data need only pass through this single output driver, so no additional delay is imposed on the output data by the latch circuitry. When the latch circuitry is enabled, the output data is allowed to pass through a feedback loop coupled to the output line. The feedback loop may be based on a pair of cross-coupled inverters or more complex logic for handing control signals such as synchronous and asynchronous clear and load signals, etc. The feedback loop stores (latches) the output data.

Flip-flop functionality may be provided by adding a flip-flop in parallel with the zero-delay latch circuitry. If desired, pulse generation circuitry may be used with other latch circuitry to emulate flip-flop functions without using a complete parallel flip-flop in the circuit. The pulse generation circuitry may be based on a delay-line arrangement or may use clock completion sensing circuitry.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to latch circuits that may be used to implement latch-based logic circuit designs. The invention also relates to programmable logic regions and programmable logic device integrated circuits that use such latch circuits.

Figure 1:
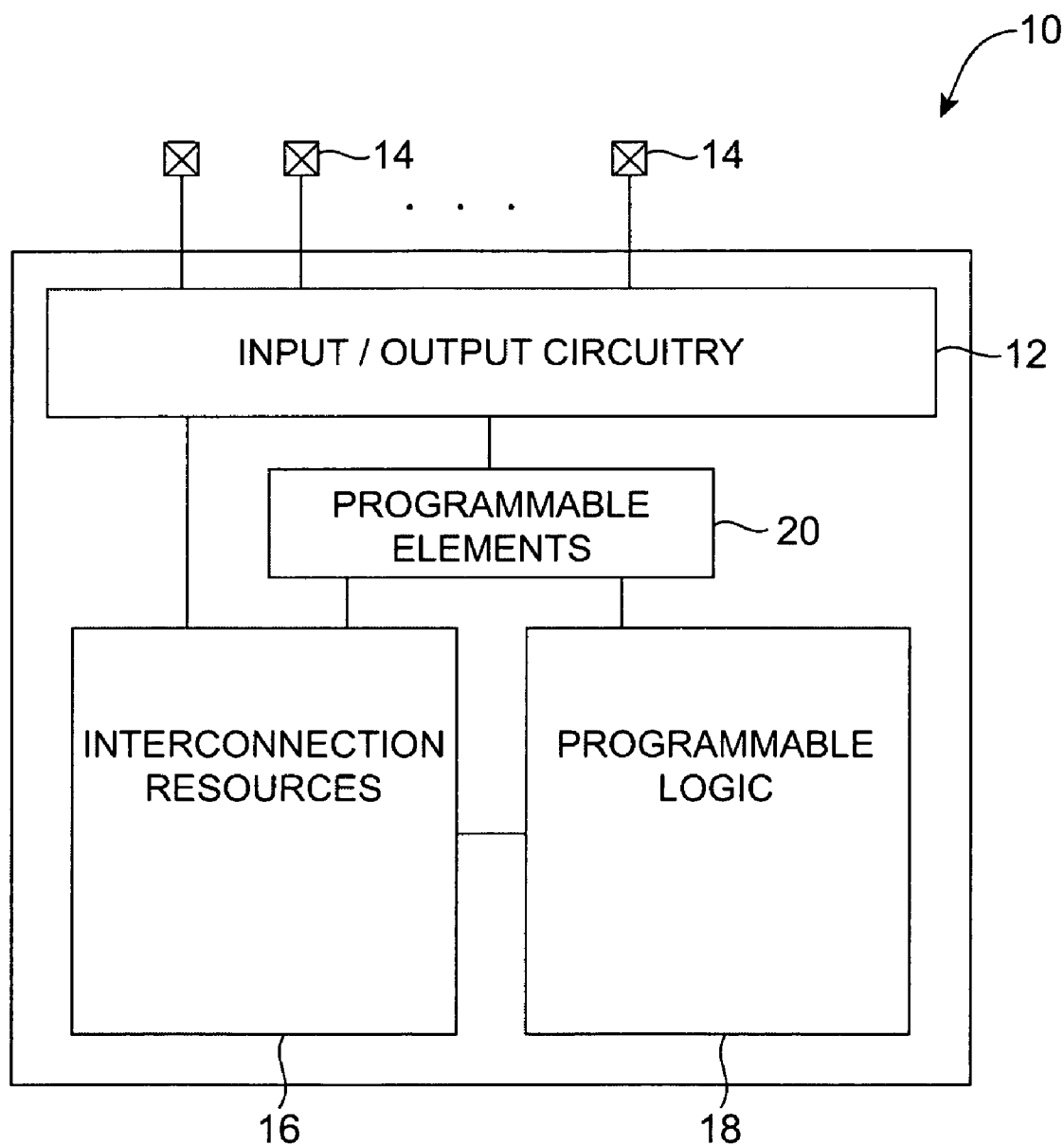
FIG. 1 is a schematic diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Programmable logic 18 may include combinational and sequential logic circuitry. The programmable logic 18 may be configured to perform a custom logic function.

Programmable logic device 10 may be based on any suitable programmable technology. With one suitable approach, configuration data (also called programming data) may be loaded into programmable elements 20 using pins 14 and input/output circuitry 12. The programmable elements (also sometimes called configuration bits or programmable function control elements) may each provide a static control output signal that controls the state of an associated logic component in programmable logic 18.

As an example, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 10, programmable elements are preferably provided with configuration data by a user (e.g., a logic designer). Once provided with configuration data, the programmable elements 20 selectively control (e.g., turn on and off) portions of the circuitry in the programmable logic 18 and thereby customize its functions so that it will operate as desired.

The circuitry on device 10 may be controlled using signals from external sources (e.g., control signals received from other integrated circuits via input/output circuitry 12) or signals from internal circuitry such as programmable elements 20 and programmable logic 18. The signals from programmable elements 20 generally do not change once device 10 has been programmed, so these signals may be referred to as static signals. The signals from programmable logic 18 generally change in real time during the operation of programmable logic device 10, so these signals may be referred to as dynamic signals.

Figure 2:
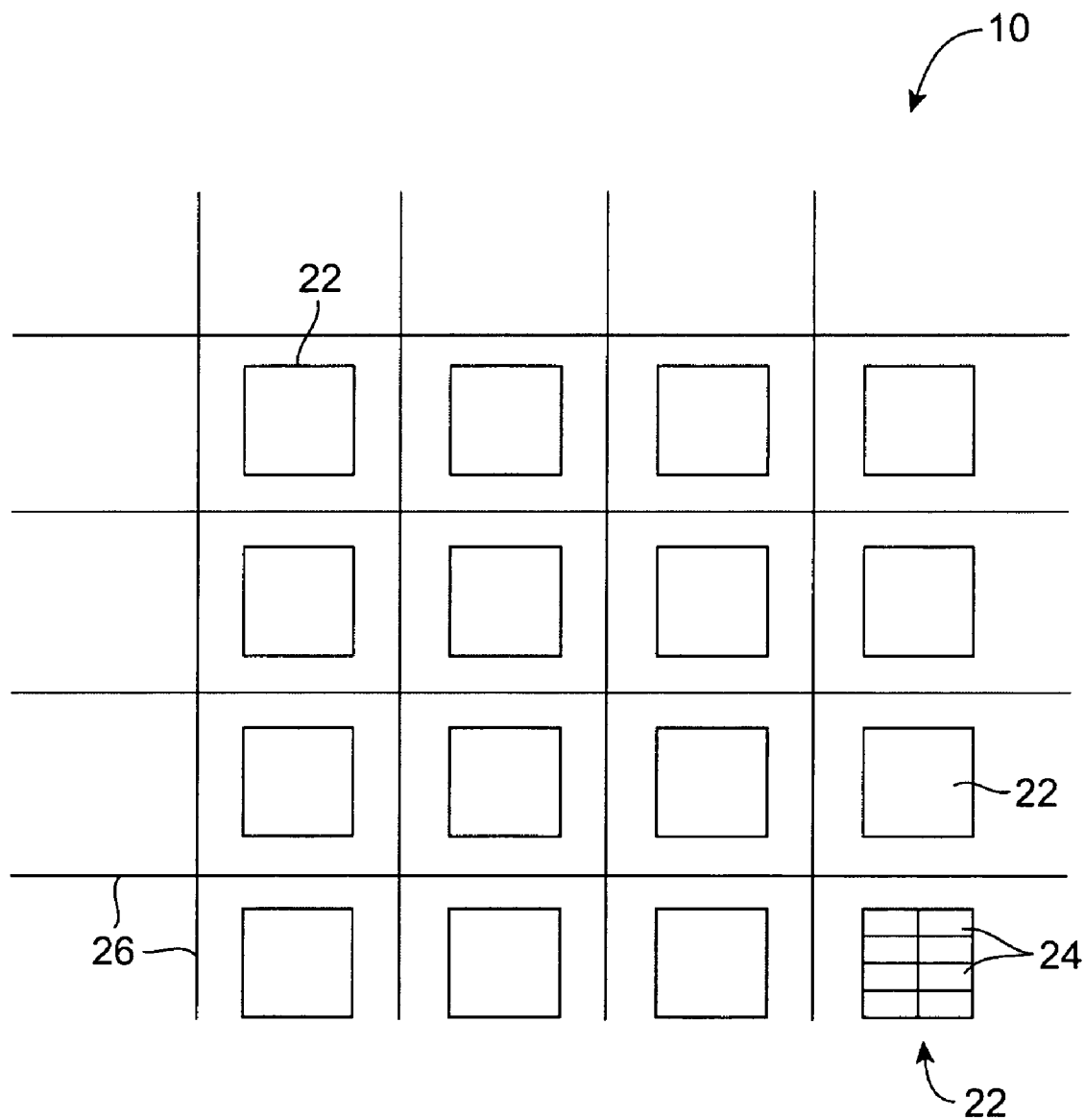
FIG. 2 is a schematic diagram of an illustrative programmable logic device integrated circuit in accordance with the present invention showing how programmable logic may be provided using rows and columns of programmable circuitry.

The circuitry of device 10 may be organized using any suitable architecture. As an example, the logic of programmable logic device 10 may be organized in a series of rows and columns of larger programmable logic regions or areas 22 each of which contains multiple smaller logic regions or areas 24 as shown in FIG. 2. These logic resources may be interconnected by interconnection resources such as associated vertical and horizontal conductors 26. Conductors 26 may include global conductive lines that span substantially all of device 10, fractional lines such as half-lines or quarter lines that span part of device 10, staggered lines of a particular length (e.g., sufficient to interconnect several logic areas), smaller local lines that interconnect logic regions 24 with other logic regions 24 in a given area 22, or any other suitable interconnection resource arrangement. If desired, the logic of device 10 may be arranged in more levels or layers in which multiple large areas 22 are interconnected to form still larger portions of logic. Still other device arrangements may use logic that is not arranged in rows and columns.

In some logic devices 10, the larger portions of logic such as logic area 22 may be referred to as "logic array blocks" (LABs) and the smaller portions of logic such as logic regions 24 may be referred to as logic elements (LEs). This is merely one illustrative logic device arrangement 10. For clarity, the present invention will sometimes be described in terms of logic regions 24 that are labeled as "logic elements" (LEs). In general, however, such logic element circuitry may be provided in any suitable logic region or portion of logic in any suitable programmable logic device architecture. Similarly, although the logic elements shown in the FIGS. are sometimes depicted as including combinational logic based on look-up tables (LUTs), this is merely illustrative. Logic regions having any suitable combinational logic may be used in device 10 if desired.

Figure 3:
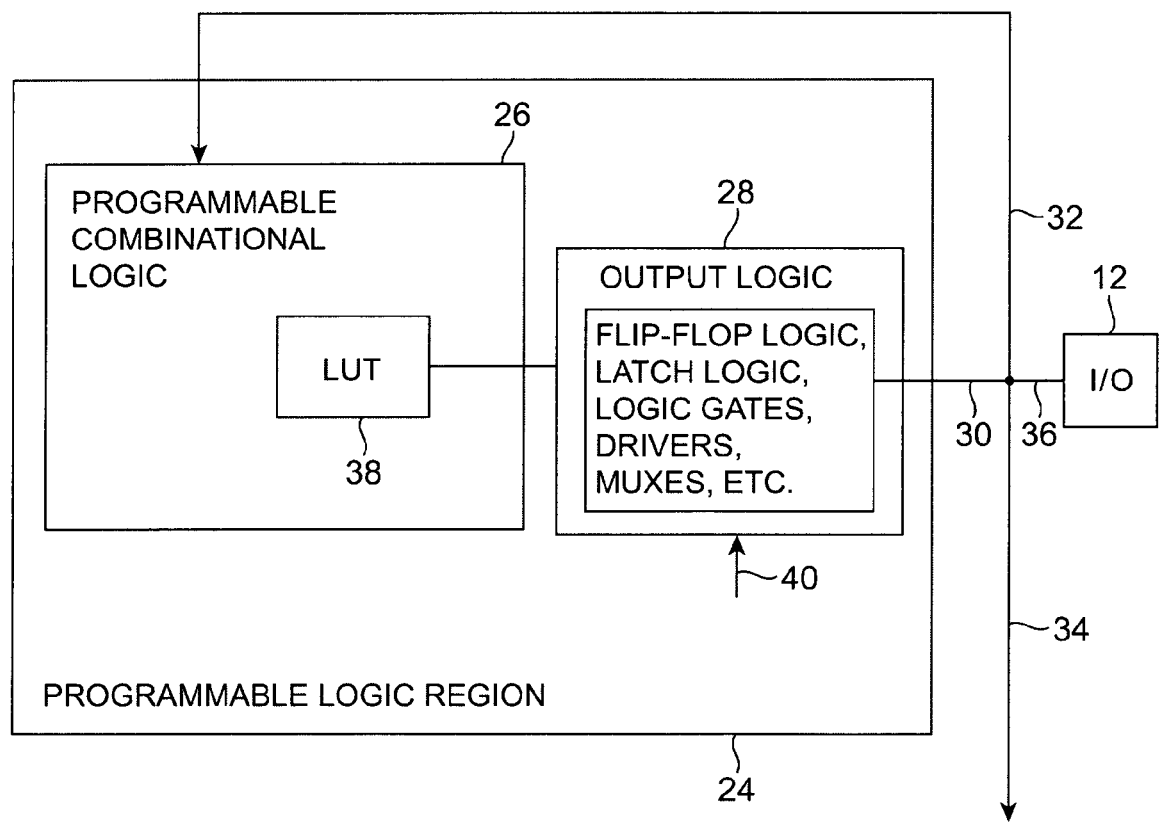
FIG. 3 is a schematic diagram of a region of programmable logic on a programmable logic device in which a combinational logic output is supplied to the logic region output line using output logic that can contain latch logic in accordance with the present invention.

An illustrative programmable logic device logic region 24 is shown in FIG. 3. Programmable logic region 24 may have programmable combinational logic 26. Logic 26 may generate output signals (output data) that are provided to logic region output line 30 via output logic 28. Combinational logic 26 may use a look-up table such as look-up table 38 or any other suitable combinational logic to produce its output. Output logic 28 may include flip-flop logic, latch logic, logic gates, drivers, multiplexers (muxes), and other suitable logic circuitry. The output logic 28 may be controlled by data and/or control signals, as shown by line 40.

The logic region output line 30 may provide the output of combinational logic 26 to programmable logic device input/output logic 12 via interconnection resources 16 of FIG. 1 (depicted as line 36 in FIG. 3). If desired, feedback paths may be used to feed back the output signal to one of the combinational logic inputs (see, e.g., path 32). Paths such as path 34 may be used to route the output signals from a logic region 24 to other logic regions (e.g., using local lines or resources) or to other portions of logic device 10 (e.g., via longer, global resources, etc.).

Figure 4:
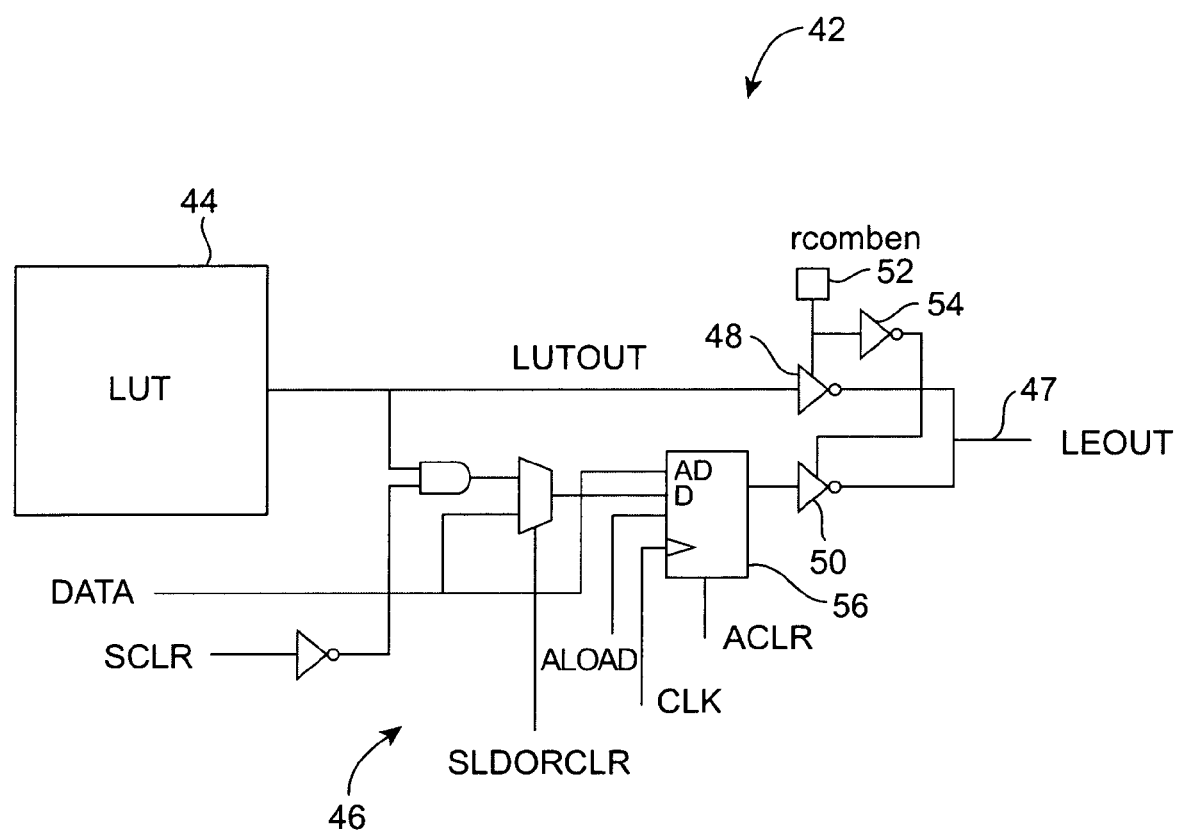
FIG. 4 is a circuit diagram of a conventional programmable logic device logic element having flip-flop-based output logic.

A conventional logic element 42 having a look-up table 44 and associated output logic 46 is shown in FIG. 4. The output of look-up table 44 is provided at logic element output line 47. A flip-flop 56 may be used to register the output signal. The flip-flop may be switched into or out of the output path between look-up table 44 and output line 47 by generating suitable control signals with programmable element 52. The output of element 52 is applied to tri-state driver 48 and (in inverted form via inverter 54) to tri-state driver 50. When the output of element 52 is in one state, the look-up table output LUTOUT is applied directly to LEOUT 47 via driver 48, while the output from flip-flop 56 is disconnected from the circuit. When the output of element 52 is in another state, the driver 48 is tri-stated and the LUTOUT is applied to LEOUT in registered form via flip-flop 56. The circuitry of output logic 46 may be used to load data into flip-flop 56 and to synchronously and asynchronously load or clear flip-flop 56.

The logic element arrangement of FIG. 4 allows a logic designer to directly connect the output of look-up table 44 to the logic element output 47 via an output driver 48 or to use a flip-flop to store the output of look-up table 44 before providing this stored output data to output 47. With such arrangements, the benefits of storing the output of LUT 44 cannot be obtained without incurring the delays associated with using a flip-flop-based approach. When the straight-through path formed by LUTOUT, driver 48, and LEOUT 47 is used, no data storage capabilities are available to maintain or store the value of LUTOUT.

In accordance with the present invention, logic regions such as logic region 24 (FIG. 3) are provided with latch circuitry. The latch circuitry may be used by a logic designer to latch (store) data from the output of the logic region in a latch-based design without the delays associated with using a purely flip-flop-based arrangement of the type described in connection with FIG. 4. The latch circuitry may be provided as part of output logic 28 (FIG. 3) and may be controlled by signals received at one or more control/data input lines such as depicted by line 40 (FIG. 3).

Figure 5:
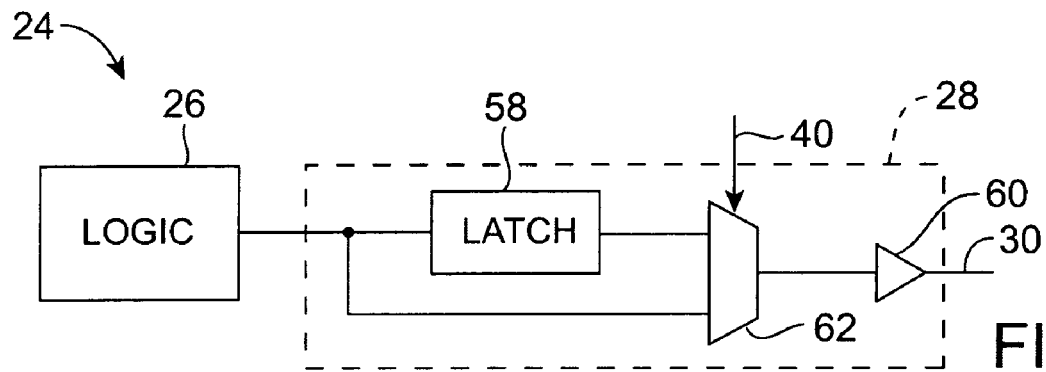
FIG. 5 is schematic diagram of an illustrative programmable logic region having a latch that may be bypassed using a bypass multiplexer when latching is not desired in accordance with the present invention.
Figure 6:
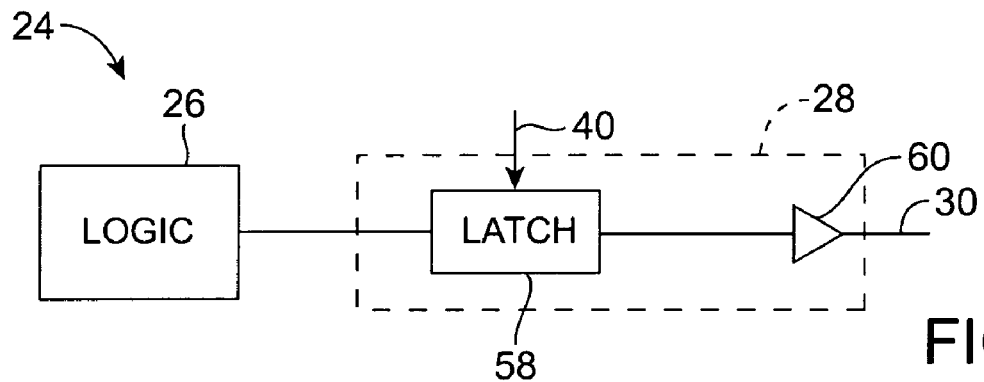
FIG. 6 is schematic diagram of an illustrative programmable logic region having a latch that may be directed to operate in flow-through mode when latching is not desired in accordance with the present invention.
Figure 7:
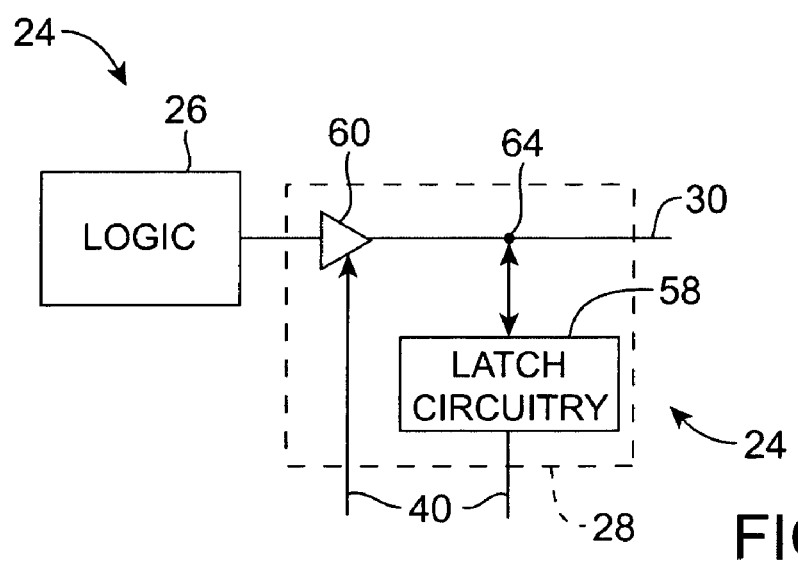
FIG. 7 is schematic diagram of an illustrative programmable logic region having latch circuitry connected to the logic region's output path downstream from the logic region's output driver in accordance with the present invention.

Any suitable arrangement may be used for connecting the latch circuitry with the combinational logic 26. Three illustrative approaches are shown in FIGS. 5, 6, and 7. With each of these approaches, an output driver 60 is used to drive signals onto the output line 30. The output driver allows the signals to be conveyed over interconnection resources 16 (FIG. 1) without undue delay. The output driver (also sometimes called an output buffer) may be provided using any suitable driver circuitry.

With the approach shown in FIG. 5, the output logic 28 of logic region 24 has a latch 58 that is provided on one of two parallel output branches. A multiplexer 62, which is controlled by control input 40, may be used to route signals through the desired path. When the control signal applied to multiplexer 62 has one state (e.g., a logic low), the output data is routed through the upper branch and is latched by latch 58 on its way to output 30. When the control signal applied to multiplexer 62 has another state (e.g., a logic high), the output from combinational logic 26 is routed through the lower branch. No latch is present in the lower branch of output logic 28, so the output data passes directly through output driver 60 to logic region output 30.

With the approach shown in FIG. 6, output logic 28 does not have a parallel bypass path around latch 58. Rather, a latch 58 is used that can be turned into a flow-through device by appropriate application of a control signal via input 40. When it is desired to use latch 58 to latch the output from combinational logic 26, the control signal is used at input 40 that has a first state (e.g., a logic low). A control signal with a second state (e.g., a logic high) may be applied at input 40 when the latching function of latch 58 is not desired. In this condition, the latch operates as a flow-through device, so data on the input of the latch is passed unchanged to its output (i.e., the latch 58 operates as a non-latching signal path).

With the approach shown in FIG. 7, output logic 28 has latch circuitry 58 (also called keeper logic) that is connected to the output line between combinational logic 26 and logic region output 30 at one or more nodes such as node 64. With this type of arrangement, circuitry 58 is connected to the output path downstream from the output driver 60 (i.e., after the data from the combinational logic or combinational logic 26 has passed through the output driver 60). As a result, the output driver 60 can help drive data into circuitry 58. Driver 60 may therefore work with the circuitry of latch circuitry 58 to perform latch functions, without requiring that a full latch be imposed directly in the path between logic 26 and output 30 (as with the arrangements of FIGS. 5 and 6).

Figure 8:
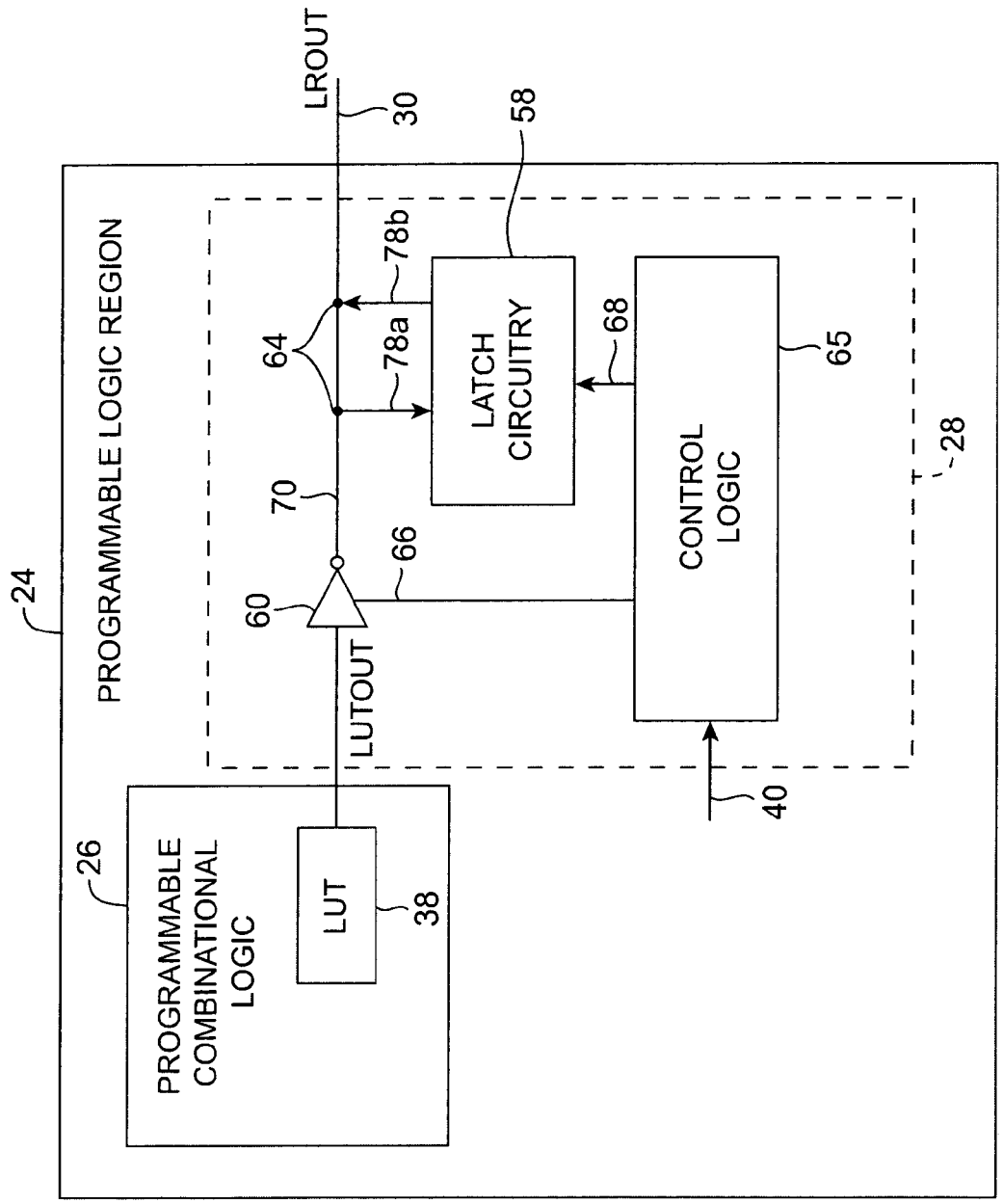
FIG. 8 is a diagram of an illustrative programmable logic region having downstream latch circuitry and associated control logic in accordance with the present invention.

An illustrative programmable logic region 24 in which latch circuitry 58 is connected to the output path joining combinational logic 26 with logic region output line 30 at a location 64 that is downstream from output driver 60 is shown in FIG. 8. Output logic 28 of logic region 24 of FIG. 8 has control logic 65 for controlling the latch functions performed by output driver 60 and the latch circuitry 58. When it is desired to load latch circuitry 58 with data from combinational logic 26, output driver 60 may be enabled (e.g., by applying a suitable enable control signal to driver 60 via control input 66). At the same time, control logic 65 may use one or more lines such as line 68 to direct latch circuitry 58 to store the data value appearing on the output 70 of output driver 60 (and on node(s) 64).

Control logic 65 may be controlled by signals applied to input 40. Input 40 may include one or more conductive lines and may receive control signals and/or data (to be used for control and/or data functions). As an example, input 40 may receive one or more static control signals from the outputs of programmable elements 20 (FIG. 1) that have been configured by configuration data. As another example, data or dynamic control signals from programmable logic 18 may be provided in real time to input 40 to be loaded into latch circuitry 58, to help clear latch circuitry 58, to set latch circuitry 58 (a form of data loading), or to otherwise control and/or load output driver 60 and latch circuitry 58 as desired.

Figure 9:
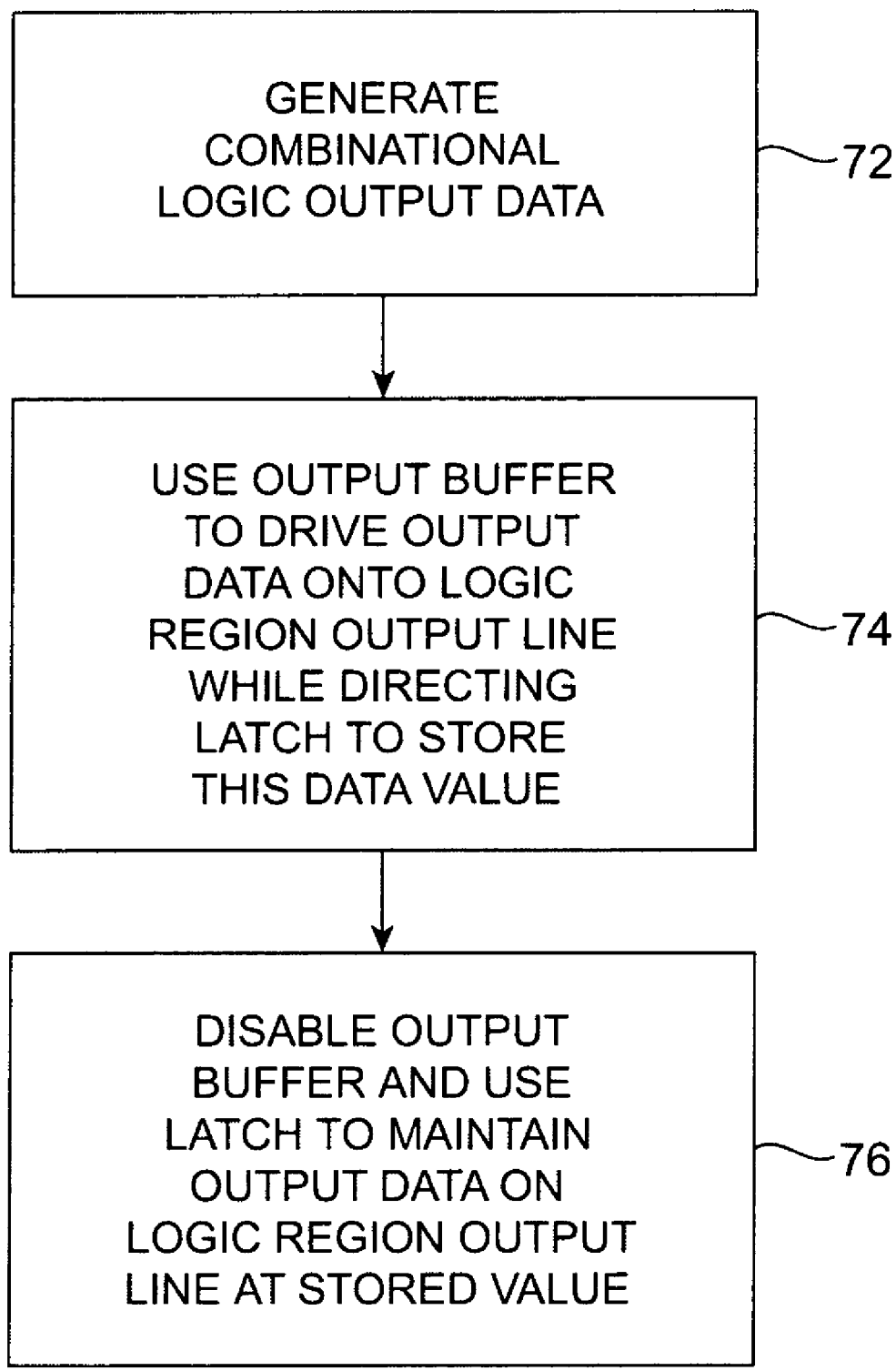
FIG. 9 is a flow chart of illustrative steps involved in using the latch-based circuitry of FIG. 8 in accordance with the present invention.

Illustrative steps involved in operating a programmable logic device 10 and the circuitry in such a device using a latch-based logic region arrangement of the type described in connection with FIG. 8 are shown in FIG. 9.

At step 72, an output signal may be generated by combinational logic 26 (FIG. 8). Combinational logic 26 may be part of the core logic of the programmable logic device 10 (i.e., part of programmable logic 18 of FIG. 1). The output data from combinational logic 26 may be provided by a look-up table such as look-up table 38 of FIG. 8 or using any other suitable combinational logic 26.

At step 74, the logic region output driver 60 (FIG. 8) may be used to drive the output data from combinational logic 26 onto output 70 and the rest of the output path between the combinational logic output LUTOUT and the logic region output LROUT (LEOUT). The output driver 60 may be turned on (i.e., its output made to respond to its input) by applying a suitable enable control signal at input 66 from control logic 65. During step 74, control logic 65 sends one or more control signals to latch circuitry 58 (e.g., via one or more lines such as line 68) that direct latch circuitry 58 to store the data value that is being driven into the latch circuitry via output 70. (In the schematic diagram of FIG. 8, paths 78a and 78b serve to connect output 70/nodes 64/output 30 with the latch circuitry 58.) During latching operations, the driver 60 therefore operates as part of a latch with latch circuitry 58, by helping to store the desired combinational logic output data in the latch formed by these components.

After the desired data has been stored in the latch, the output buffer 60 may be disabled (tri-stated) by applying a disable control signal to output driver 60. This ensures that the data will be maintained in the latch and will not be overwritten by new combinational output data. The stored data value will be continuously provided to output 30 (via a line such as line 78 of FIG. 8) until another data value is loaded into the latch by repeating steps 72 and 74.

Any suitable circuitry may be used to implement the latch-based circuitry for the logic region 24. An illustrative circuit implementation in which a clock signal CLK and a single static control signal S may be used to control the latching operations of a programmable logic region 24 is shown in FIG. 10.

Figure 10:
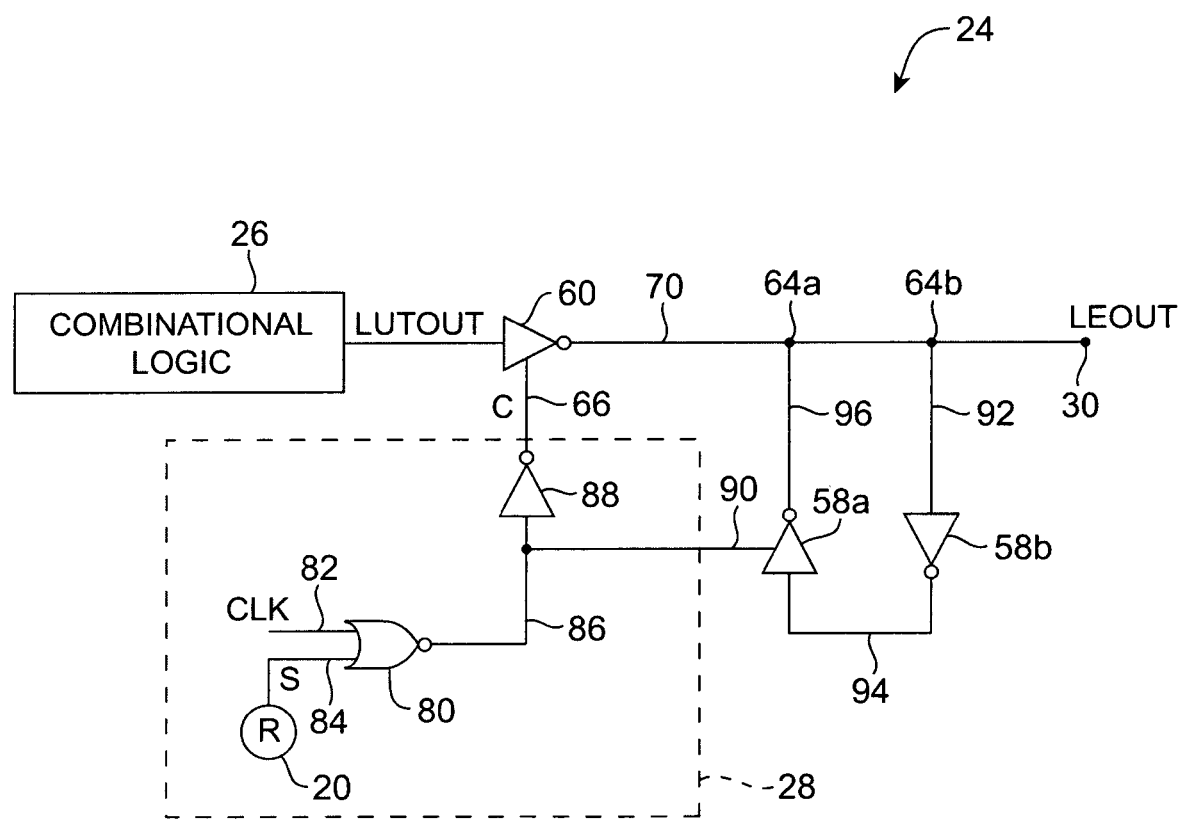
FIG. 10 is a circuit diagram of an illustrative programmable logic region having output logic based on a latch in accordance with the present invention.

As shown in FIG. 10, the output path between the output LUTOUT of combinational logic 26 (e.g., a LUT) and the output 30 of logic region 24 (labeled LEOUT in FIG. 10) has a tri-state driver 60. The output 70 of the driver 60 is connected to nodes 64a and 64b and to logic region output 30 (LROUT). The keeper logic formed by drivers 58a and 58b works with the output driver 60 to form a level-sensitive latch. The latch is controlled by supplying a suitable control signals at line 86. These control signals are delivered to tri-state driver 58a via line 90 and to tri-state driver 60 via inverter 88 and line 66.

Signal S at input 84 of NOR gate 80 serves as an enable/disable signal. When S is high (a logical one), the output of gate 80 on line 86 is low (a logical zero), regardless of the state of the clock signal CLK on input 82. The S signal therefore serves as a disable signal when S is high. When S is low, an inverted version of the CLK signal passes through gate 80 and is provided as clock signal C at line 86. A user (e.g., a logic designer) may disable the latch of FIG. 10 by using a programmable element 20 to provide S in the form of a static control signal (e.g., by configuring element 20 with appropriate configuration data). If desired, the user may provide control signal S in the form of a dynamic control signal (e.g., from programmable logic 18). (In the following description, many of the static control signals may be provided as dynamic control signals and vice versa, but this possibility is not discussed in detail for clarity.)

Whenever C is high, driver 60 is enabled, so that the LUTOUT signal is provided (in inverted form) to output 70. Driver 58b is on, so this signal, which is provided to the input of driver 58b via line 92, is driven onto line 94 in twice-inverted form (i.e., as a non-inverted version of LUTOUT). When C is high, the signal on line 90, which is the inverted version of C, is low. This disables driver 58a. Because driver 58a is disabled, the output of driver 58a on line 96 floats and does not contend with the data value on output 70. During the time that C is high, any change in the value of LUTOUT due to changes within combinational logic 26 will be tracked (in inverted form) by the output signal on line 30. This is the behavior required of a level-sensitive latch when the clock is asserted.

When C goes low (when the level of the CLK signal changes by going high), the driver 60 is disabled (tri-stated). At the same time, the signal on line 90 is high. This turns on driver 58a, so that the data stored on line 94 is driven onto line 96 and logic region output 30. The low C signal therefore disconnects the combinational logic 26 from the circuit, while allowing the cross-coupled inverters 58a and 58b to operate as a storage element to maintain the data value on line 30 that was present just before the C signal changed.

The circuitry of FIG. 10 can therefore be configured to act as though no latch is present (by programming the control signal S to be high) or can be configured to serve as a level-sensitive latch (by programming the control signal to be low). Whenever configured to serve as a level-sensitive latch by configuring S to be low, the output 30 tracks the LUTOUT from combinational logic (if C is high) and is frozen at the last data value from LUTOUT (if C is low). The output value LROUT is inverted with respect to LUTOUT, but this inversion can be accounted for by keeping track of the polarity of the signal during subsequent operations. In general, the polarities of the data and control signals described (e.g., whether a particular logic value is high or low or a logical one or a logical zero) are not critical. These values can be physically reversed (by using inverters or other appropriate logic gates in device 10) or the states of the inverted signals can be tracked using appropriate nomenclature. Moreover, some tri-state gates require active high and active low control inputs. Such tri-state gates may be used if desired.

Figure 11:
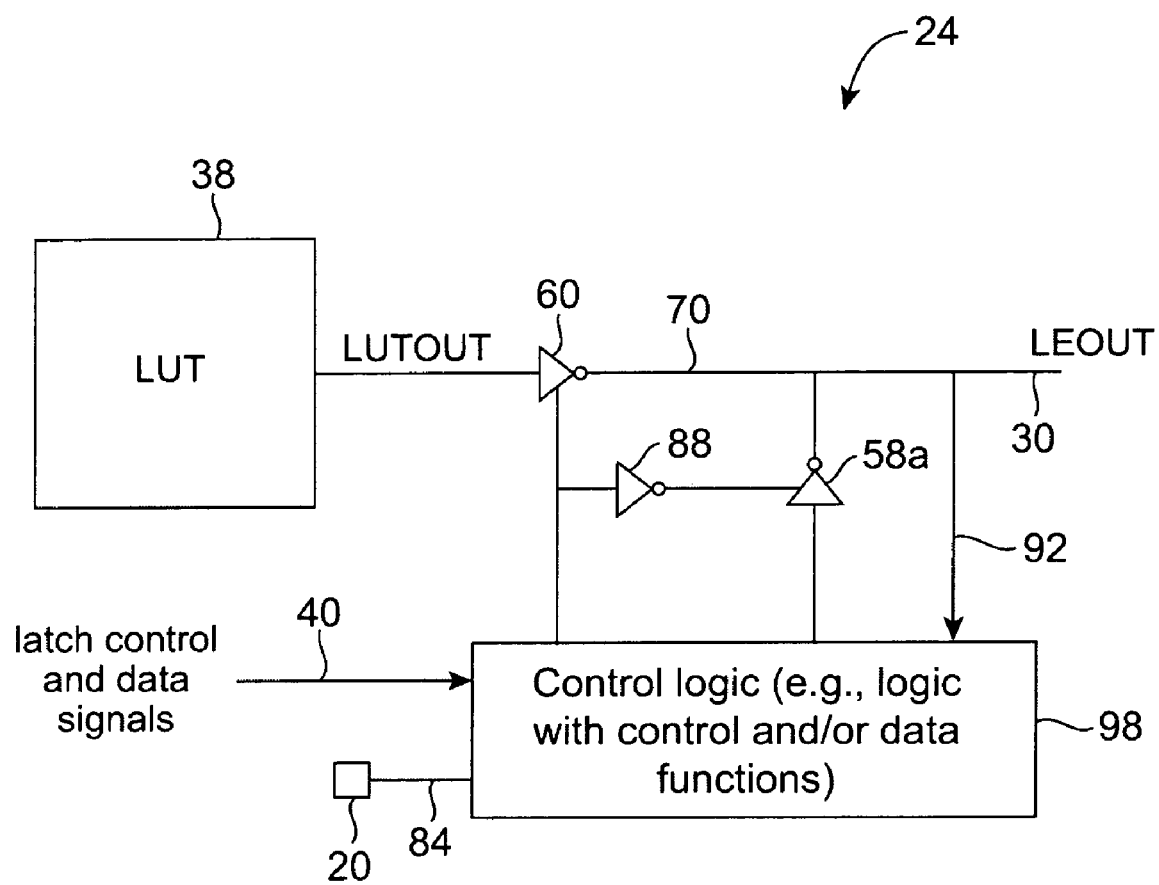
FIG. 11 is a more generalized circuit diagram of an illustrative latch-based programmable logic region with control logic in accordance with the present invention.

A generalized version of the circuit implementation of FIG. 10 is shown in FIG. 11. In logic region 24 of FIG. 11, the logic region output data from the combinational logic (shown as look-up table 38 in this example) is provided to logic region output 30 (shown as logic element output LEOUT in this example) via driver 60 whenever the control signal on line 66 enables driver 60. Data on line 70 may be received by control logic 98 via line 92. The control logic 98 may include a driver such as driver 58b of FIG. 10 or may use other logic gates (e.g., NAND gates, AND gates, NOR gates, OR gates, etc.) to perform the same functions (while at the same time providing additional functionality).

Control logic 98 may be controlled by static control signals (e.g., a static control signal from a programmable element 20 that is provided to logic 98 via a line such as line 84) and by dynamic control signals. The signals that may be used to control the operation of logic 98 are shown generally as being provided to logic 98 via an input 40 and are labeled as being latch control and data signals. In general, these signals may be any suitable control signals and/or data signals.

The latch circuitry of FIG. 11 (and the comparable latch-based arrangements described herein) forms a "zero delay" latch, because when no latching functions are desired and the storage feedback loop provided by the extra circuitry (e.g., circuitry such as drivers 58a and 58b of FIG. 10) is switched off using an appropriate disable signal (e.g., disable signal S of FIG. 10), no extra circuit delay is imposed on the output signal being provided at output 70 beyond the unavoidable delay associated with using the necessary output driver 60. Because output driver 60 is needed in any practical logic region arrangement to drive the combinational logic data from the combinational logic 26/38 to other logic on the programmable logic device 10 through logic region output line 30, the delay associated with propagating a signal through driver 60 is not a consequence of providing latch functionality. This delay is associated with the buffering function of driver 60 and is unavoidable, so this delay does not contribute an additional delay component to the latch circuitry. (It should be noted that there is a small amount of additional loading imposed by driver 58b, but this driver 58b may be made small enough that this effect is negligible.)

With the zero delay latch, the LUTOUT signal may be directed to the logic region output 30 or the stored data from the feedback loop formed by drivers 58a and 58b (or comparable circuitry) may be directed to the logic region output 30 under the dynamic and/or static control of signals provided at inputs such as input 40.

Figure 12:
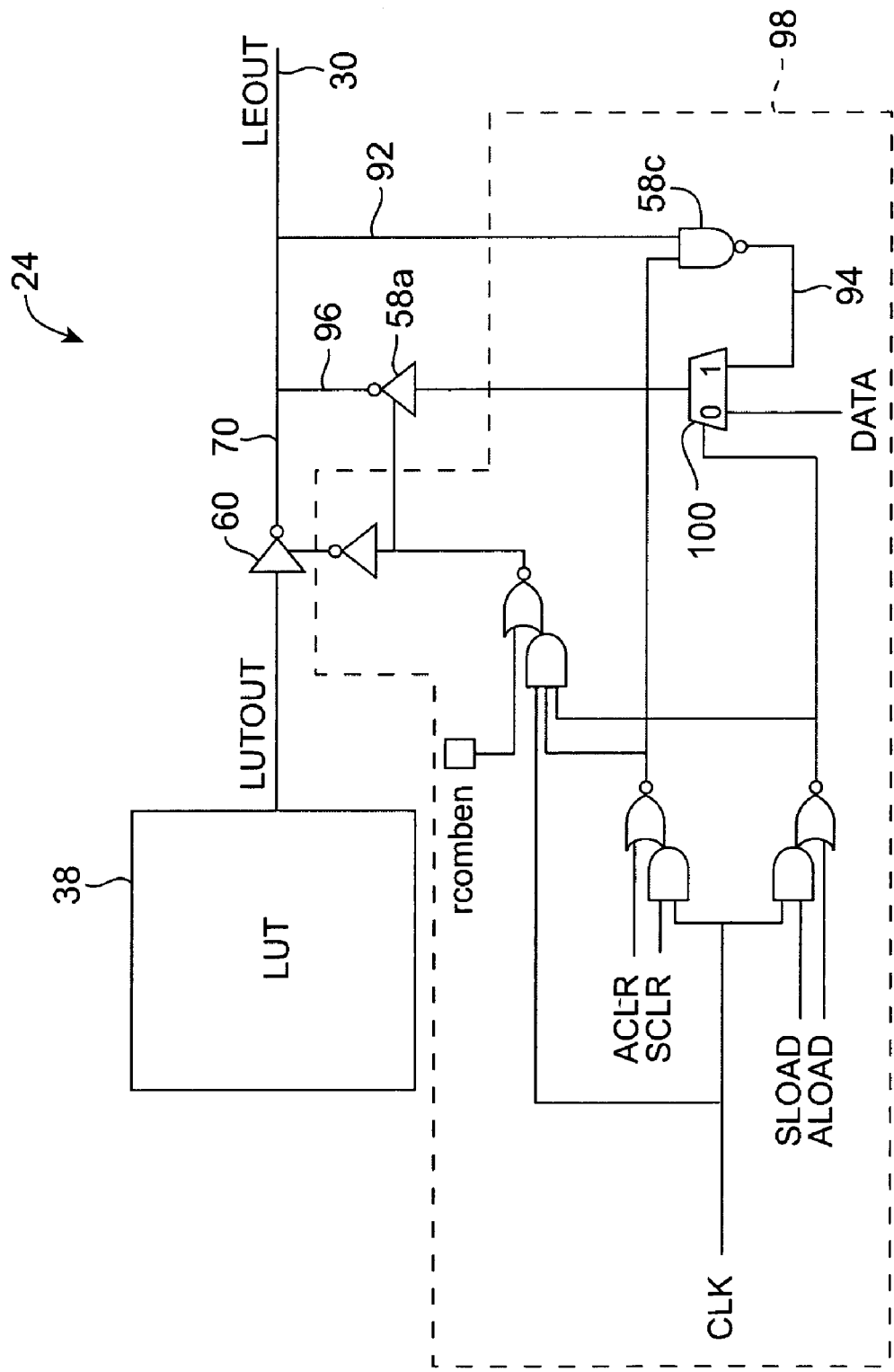
FIG. 12 is a circuit diagram of an illustrative programmable logic region having a latch and circuitry for controlling the latch and loading data into the latch in accordance with the present invention.

An illustrative circuit implementation of the control logic circuitry 98 of FIG. 11 that may be used to handle synchronous and asynchronous control signals that may be desired for a sequential circuit is shown in FIG. 12. To preserve the zero-delay property of the latch, the circuit of FIG. 12 is configured so that the path from LEOUT to LUTOUT still has only a single tri-state buffer 60. The enable signal for tri-state buffer 60 is true (i.e., a logical one or high value) when the LUTOUT signal should drive LEOUT, either as a data signal, or to load the latch. The various control signals that are shown can override the latch load. Additional logic (e.g., gate 58c and multiplexer 100) is included in the feedback path of the keeper logic formed using driver 58a, and paths 92, 94, and 96 to set the state of the keeper logic correctly.

In the example of FIG. 12, the keeper logic can be cleared to a logic low by the ACLR signal or if SCLR and CLK are asserted simultaneously. The keeper logic (keeper latch) can also be loaded either by the assertion of the ALOAD signal or by the simultaneous assertion of SLOAD and CLK.

The logic arrangement of FIG. 12 is merely illustrative. Any suitable logic arrangement may be used to introduce additional control functions into the latch-based circuitry if desired. Such logic may be configured so as to minimize delay through important paths such as the path from clock to output, whereas larger delays may be tolerated on less important paths.

Programmable logic devices 10 with latch-based circuitry may be used by users with an existing library of flip-flop-based designs or users who would like to implement at least some flip-flop-based logic designs in their devices. Some designs may be more efficient to implement in flip-flops due to constraints such as those imposed by the use of reset and load signals. Accordingly, devices 10 may, if desired, be provided with flip-flop circuitry in addition to or instead of some of the latch-based circuitry. The flip-flop functionality may be provided in a way that minimizes adverse delay and real-estate effects on device 10.

Figure 13:
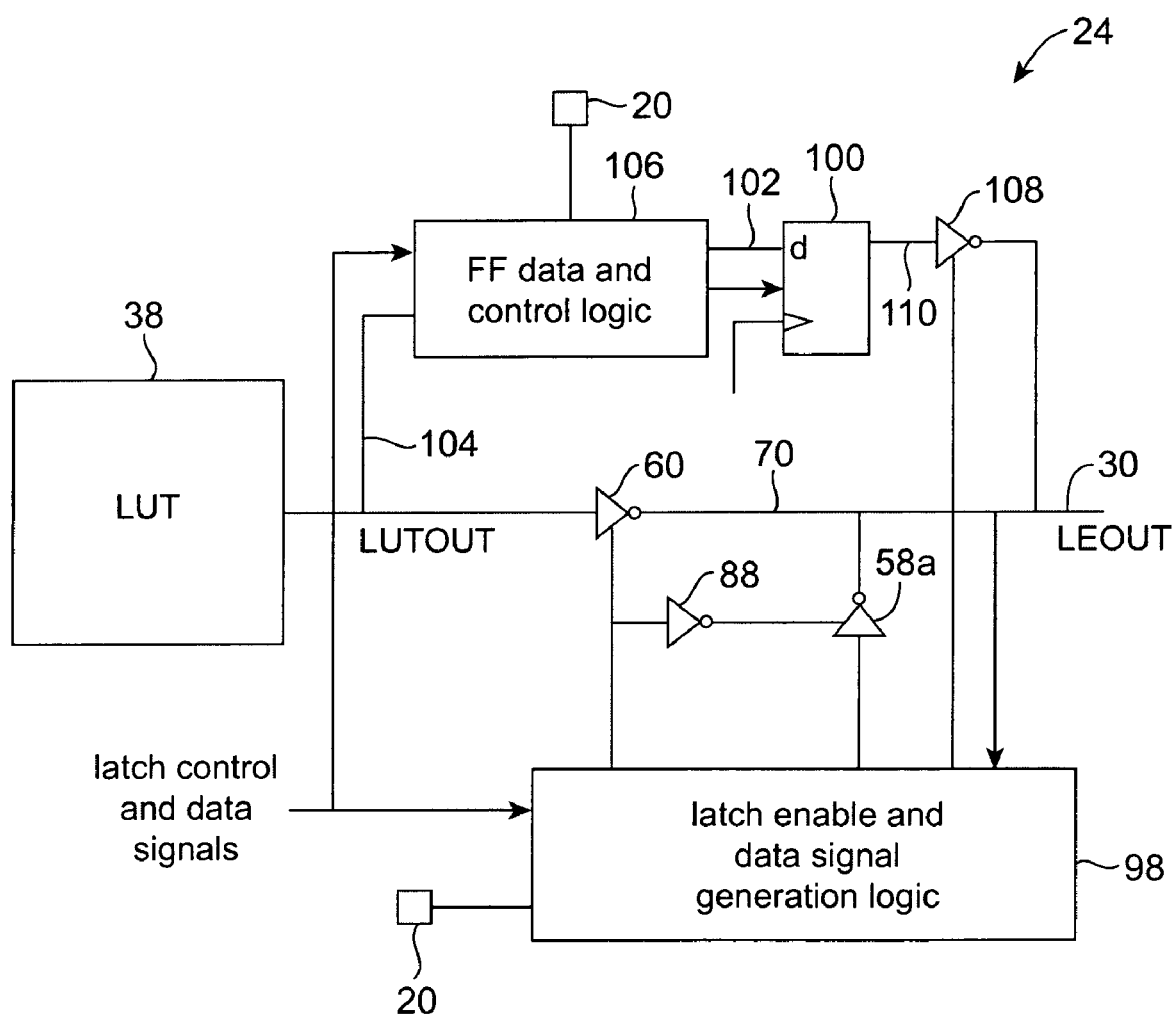
FIG. 13 is a generalized circuit diagram of a programmable logic region having flip-flop and latch circuitry in accordance with the present invention.
Figure 14:
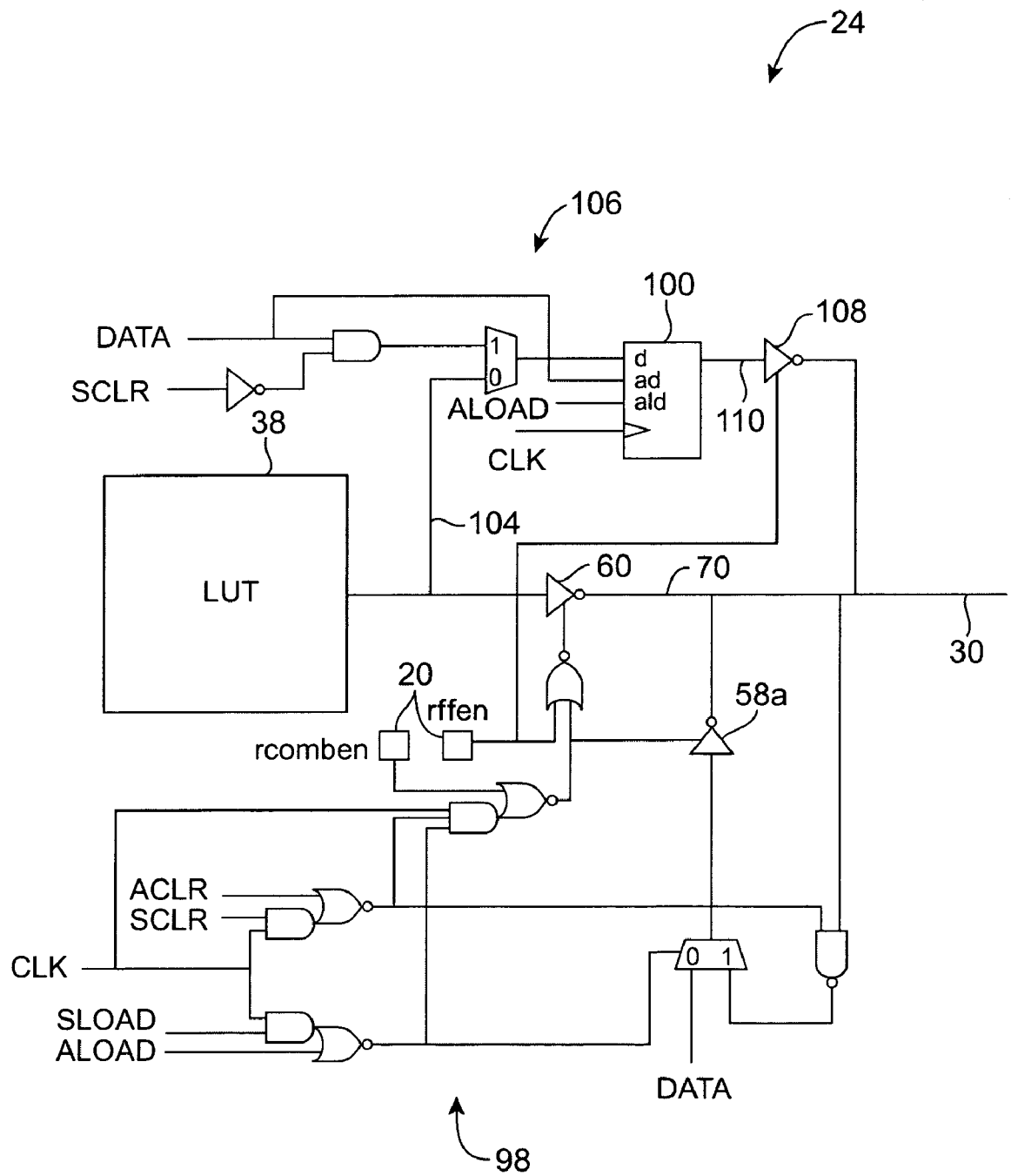
FIG. 14 is a circuit diagram of an illustrative programmable logic region having a latch and parallel flip-flop in accordance with the present invention.

One suitable approach involves adding a flip-flop 100 in parallel with the zero-delay latch in some or all logic regions 24, as shown in FIG. 13. The input 102 of the flip-flop 100 may be connected to the output LUTOUT of the combinational logic via line 104 and flip-flop control logic 106. A tri-state driver 108 may be connected to the flip-flop output 110 to drive signals passing through the flip-flop 100 onto output 30. The latching functions needed for a latch-based design can be provided by using flip-flop data and control logic 106 to block signals to flip-flop 100, while using drivers 60, 88, and 58a and the appropriate circuitry of logic 98 to form a zero-delay latch. An illustrative detailed circuit implementation of the arrangement of FIG. 13 is shown in FIG. 14.

Figure 15:
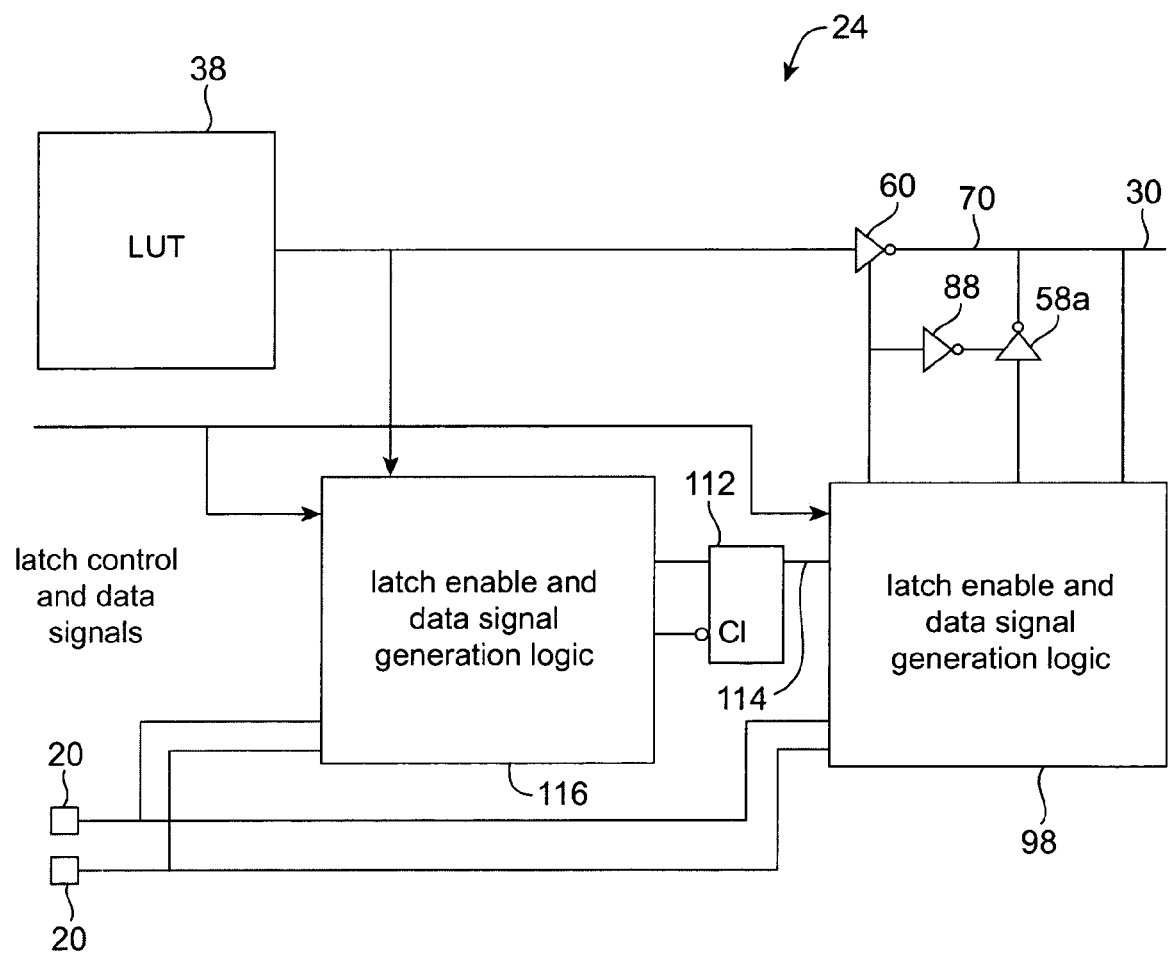
FIG. 15 is a generalized circuit diagram showing a programmable logic region having two latches that may be selectively configured to operate as a flip-flop in accordance with the present invention.

Another suitable approach involves adding an additional level sensitive latch 112 in front of the keeper latch, as shown in FIG. 15. Control logic 116 is used to control operations involving latch 112. With this approach, the additional latch 112 works with the keeper latch formed from logic 98 and drivers 60, 88, and 58a to form a master-slave flip-flop circuit. The keeper latch acts as the slave and the additional latch 112 acts as the master.

Latch control and data signals may be applied to the circuit of FIG. 15 to control the circuit. The circuit can act as a single level-sensitive latch by disabling latch 112. Alternatively, the master latch 112 can be configured to feed data into the zero-delay latch via path 114. By using two independently-controllable latches, the arrangement of FIG. 15 can provide the functions of an edge-triggered flip flop or the functions of a zero-delay latch.

Figure 16:
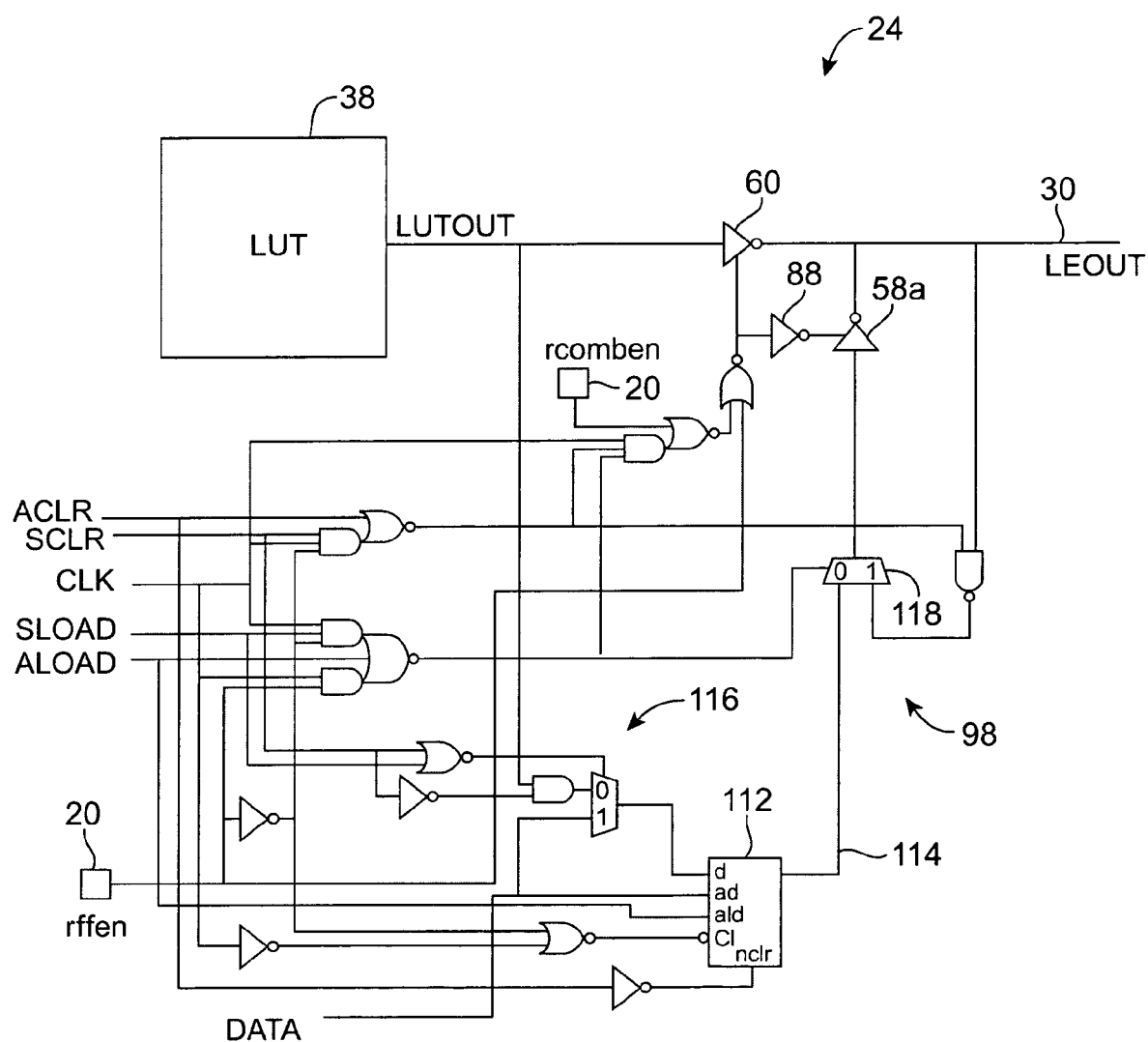
FIG. 16 is a circuit diagram of an illustrative programmable logic region having a latch that can operate as a slave with an associated master latch in accordance with the present invention.

An illustrative detailed circuit implementation of the arrangement of FIG. 15 is shown in FIG. 16. As shown in FIG. 16, a configuration bit rffen from a programmable element 20 may be set to cause the circuit to act as a flip-flop. This bit directs the keeper latch to always be enabled onto LEOUT. The configuration bit rffen is also used to disable the effect of the SLOAD and SCLR signals on the keeper latch and is used to cause the internal multiplexer 118 of the keeper latch to be used as the load path for the latch. The keeper latch is still responsive to the asynchronous signals ALCR and ALOAD.

In flip-flop mode, the keeper latch is loaded when the CLK signal is high. Control logic 116 in front of the master latch 112 loads the master latch according to the operation of the control signals: clearing the master latch 112 in the case of the assertion of ACLR or the simultaneous assertion of SCLR and negation of CLK and loading the master latch 112 in the case of the assertion of ALOAD or the simultaneous assertion of SLOAD and negation of CLK. Whenever the static control bit rffen is negated, the circuit of FIG. 16 operates as a zero-delay latch of the type shown in FIG. 11.

Another suitable approach for providing edge-triggered flip-flop functions in a programmable logic region circuit capable of serving as a zero-delay latch involves using a pulse generator. The pulse generator can be configured to generate a narrow pulse on the clock edge. The pulse is wide enough to cause the LUTOUT signal from the LUT 38 to be driven onto the output line 30, but is also narrow enough to avoid a race condition in which the signal LUTOUT propagates through two latches. These constraints can be satisfied using a pulse generator circuit that has a delay line that guarantees suitable timing or that has a self-timed circuit to produce the narrowest possible pulse by monitoring the successful latching of the LUT output value.

Figure 17:
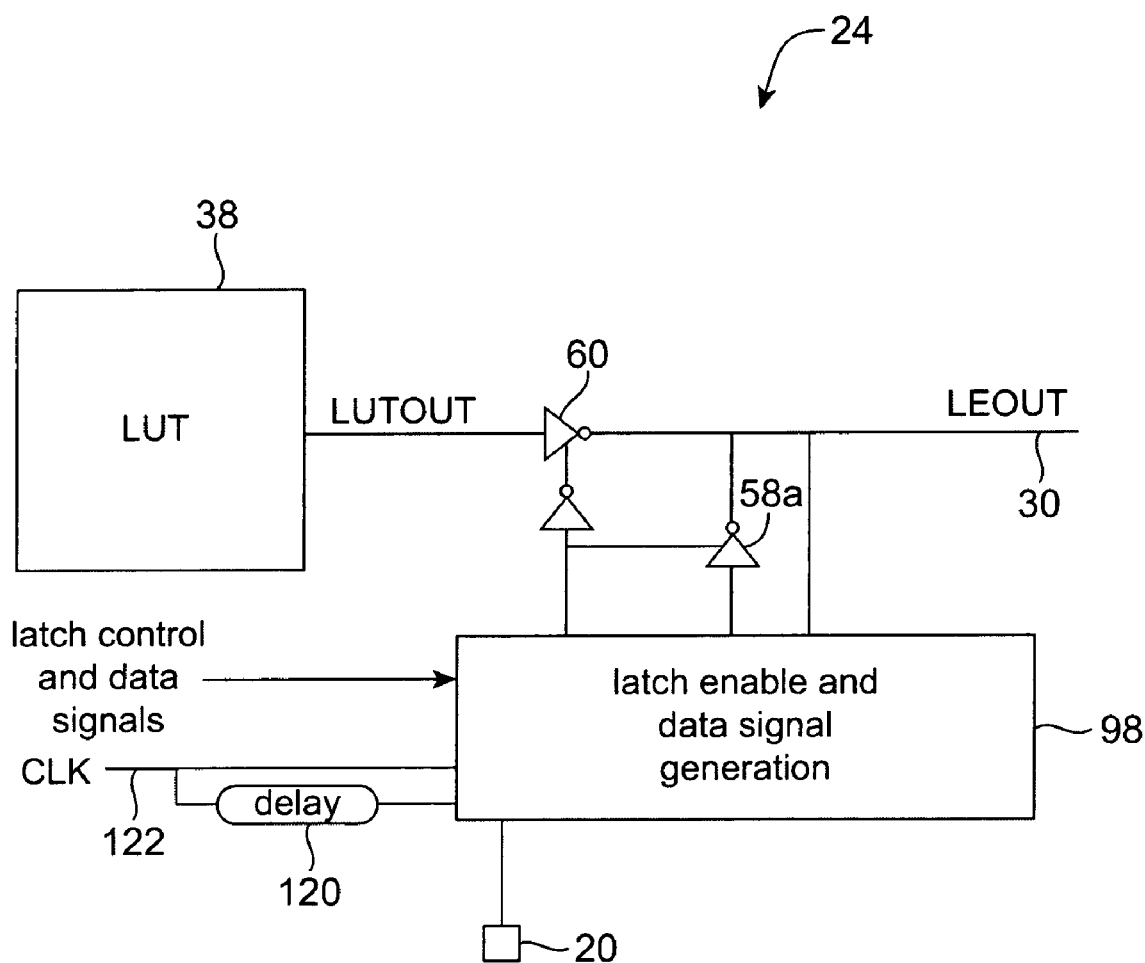
FIG. 17 is a generalized circuit diagram of an illustrative programmable logic region having a clock-pulse generation circuit for controlling a latch in accordance with the present invention.

An illustrative delay-line pulse generation circuit example is shown in FIG. 17. As shown in FIG. 17, a delay line 120 may supply a delayed version of the clock signal CLK that is supplied at input 122. The logic 98 may AND the clock with a negated version of the delayed clock to form a narrow pulse of sufficient width to latch the LUTOUT data.

Figure 18:
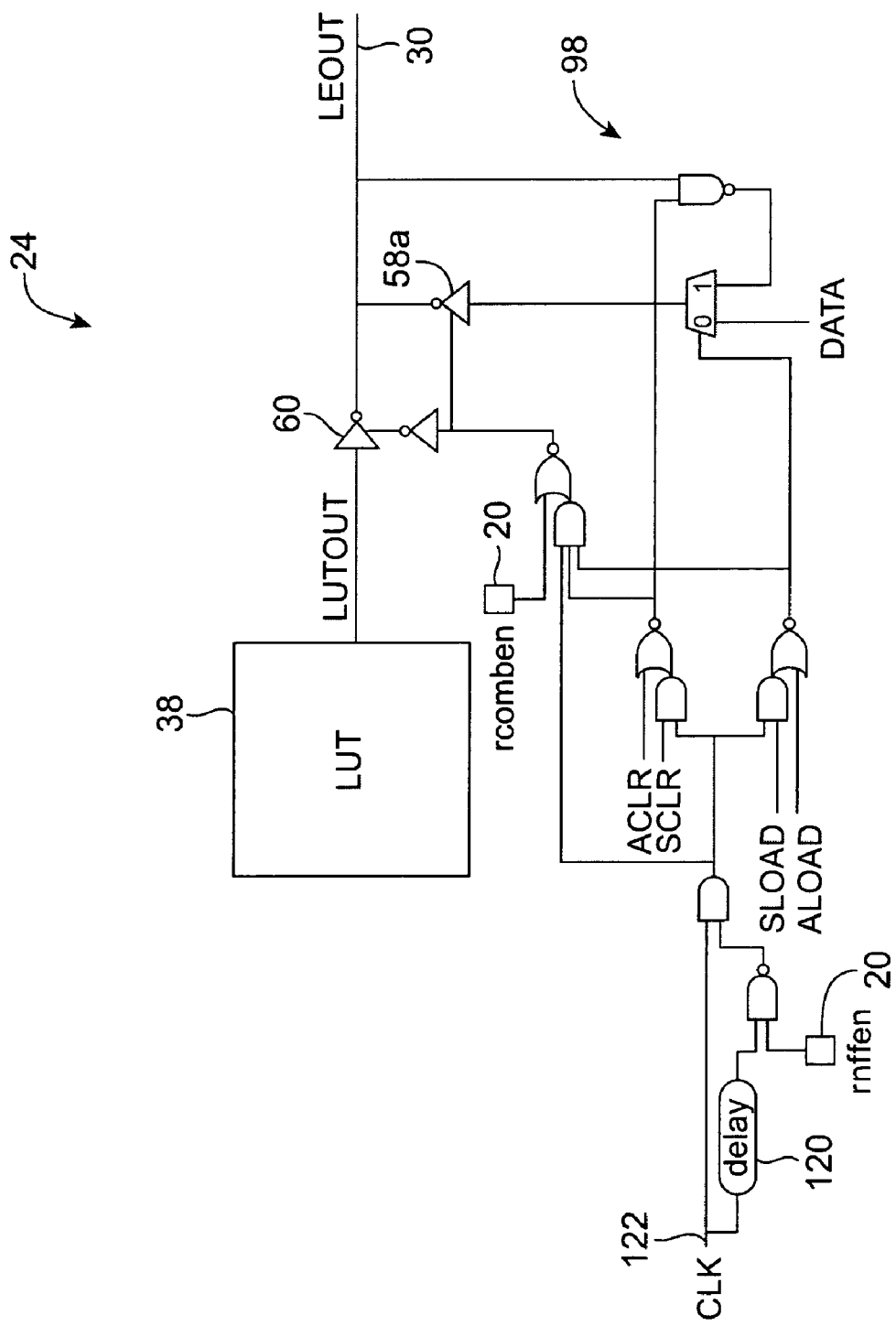
FIG. 18 is a circuit diagram of a programmable logic region having a pulse generation circuit to emulate an edge-triggered flip-flop in accordance with the present invention.

An illustrative detailed logic circuit implementation of the delay-line arrangement of FIG. 17 is shown in FIG. 18. As shown in FIG. 18, this form of programmable logic region 24 may support use of the control signals ACLR, SCLR, SLOAD, and ALOAD.

Use of a self-timed circuit approach to generate the pulses for emulating edge-triggered flip-flop functions may be even more robust than using a delay-line approach. With this approach, a self-timed circuit monitors the completion of latching to generate the minimum possible clock pulse that can latch the data value LUTOUT.

Figure 19:
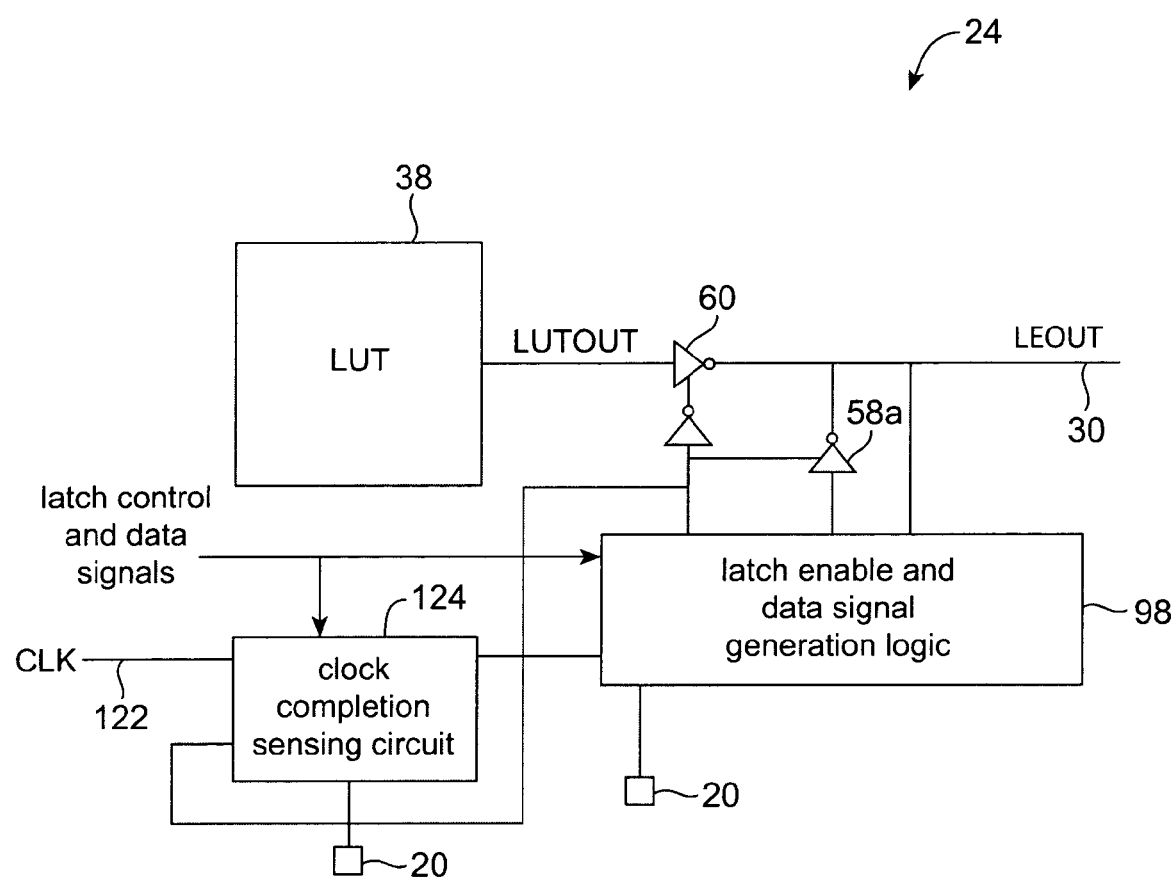
FIG. 19 is a generalized circuit diagram showing how a self-timed clock pulse arrangement can be used to control a latch in a programmable logic region in accordance with the present invention.
Figure 20:
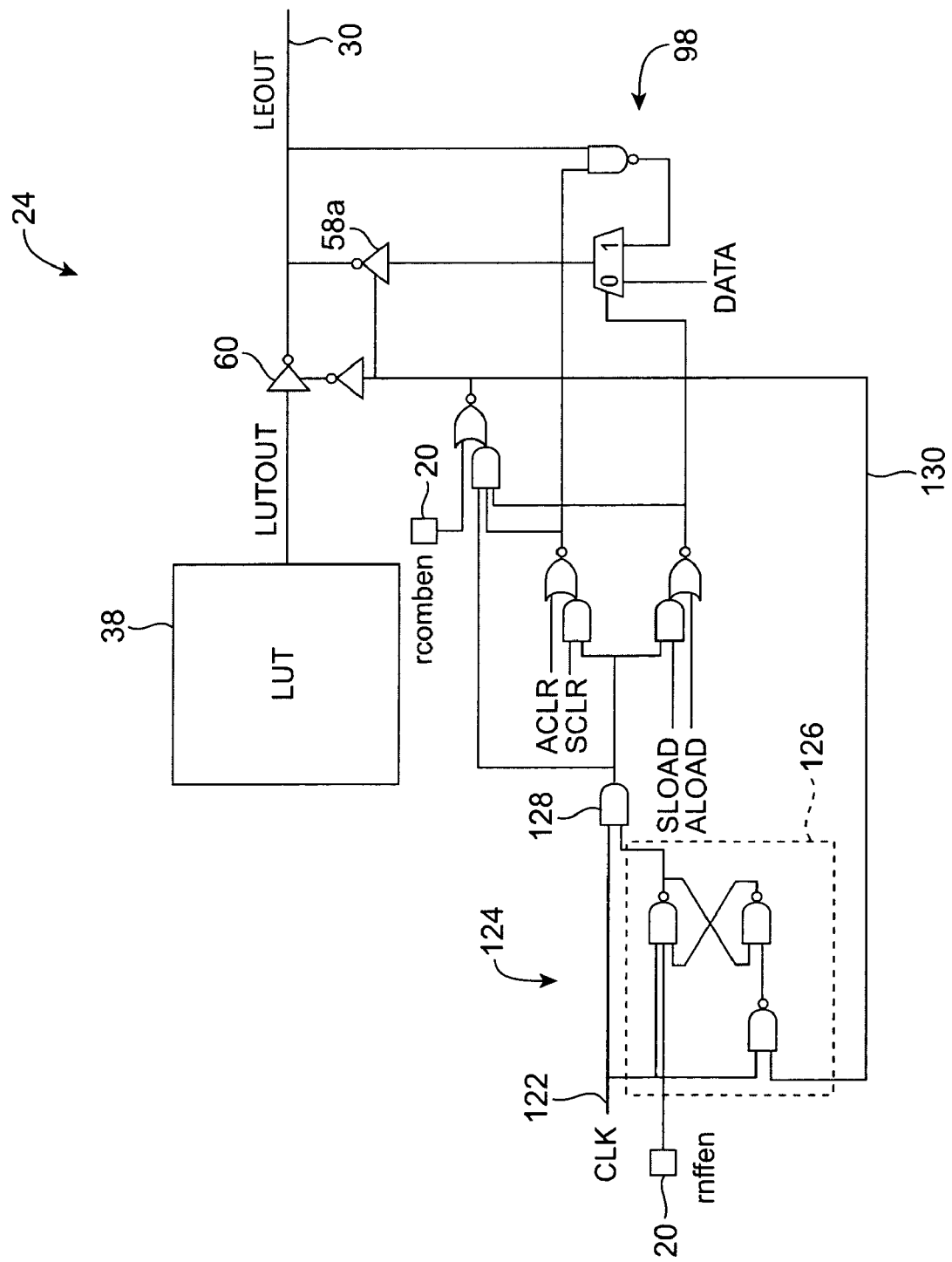
FIG. 20 is a circuit diagram of an illustrative programmable logic region with a self-timed latch circuit in accordance with the present invention.

One illustrative self-timed circuit arrangement is shown in FIGS. 19 and 20. A generalized circuit structure is given in FIG. 19. An illustrative detailed circuit implementation of the circuit of FIG. 19 is provided in FIG. 20.

In the self-timed circuit of FIG. 19, a clock completion circuit 124 asserts the clock when the CLK signal is asserted, and negates the clock when the latch enable is asserted.

As shown in the detailed circuit implementation of FIG. 20, an extra state bit may be retained using a storage circuit such as clock enable latch 126. The clock enable latch 126 is set when CLK is low, which enables the clock to propagate to the data latch via AND gate 128. The clock enable latch 126 may be reset when the data is latched.

In the clock-pulse-detecting arrangement of FIG. 20, the propagation of the clock to the tri-state enable line of the data latch formed using drivers 60 and 58a and the gates of logic 98 is detected using feedback path 130. The clock enable latch 126 is cleared when CLK is high and the clock has propagated to the enable line. The minimum propagation delay from the assertion of the tri-state driver output from driver 60 to the subsequent negation of the tri-state driver output forms a pulse width that is sufficient to latch a data value from the LUT 38 regardless of the loading on the LEOUT line 30. This loading may be configuration dependent. As an example, LEOUT line 30 may drive a number of multiplexers which present configuration-dependent loading to the LEOUT node. At the same time, the pulse is short enough that a race-through condition cannot occur (caused by the enable staying high long enough that the output value goes through a second LUT and latch on a single clock edge).

The circuit of FIG. 20 provides a substantial degree of immunity from process, voltage, and temperature variations (PVT). This is because the circuit of FIG. 20 detects the assertion of the clock pulse and because it is reasonably straightforward to guarantee that the clock completion sensing circuit 124 will not negate the clock pulse before the data has been successfully latched.

Figure 21:
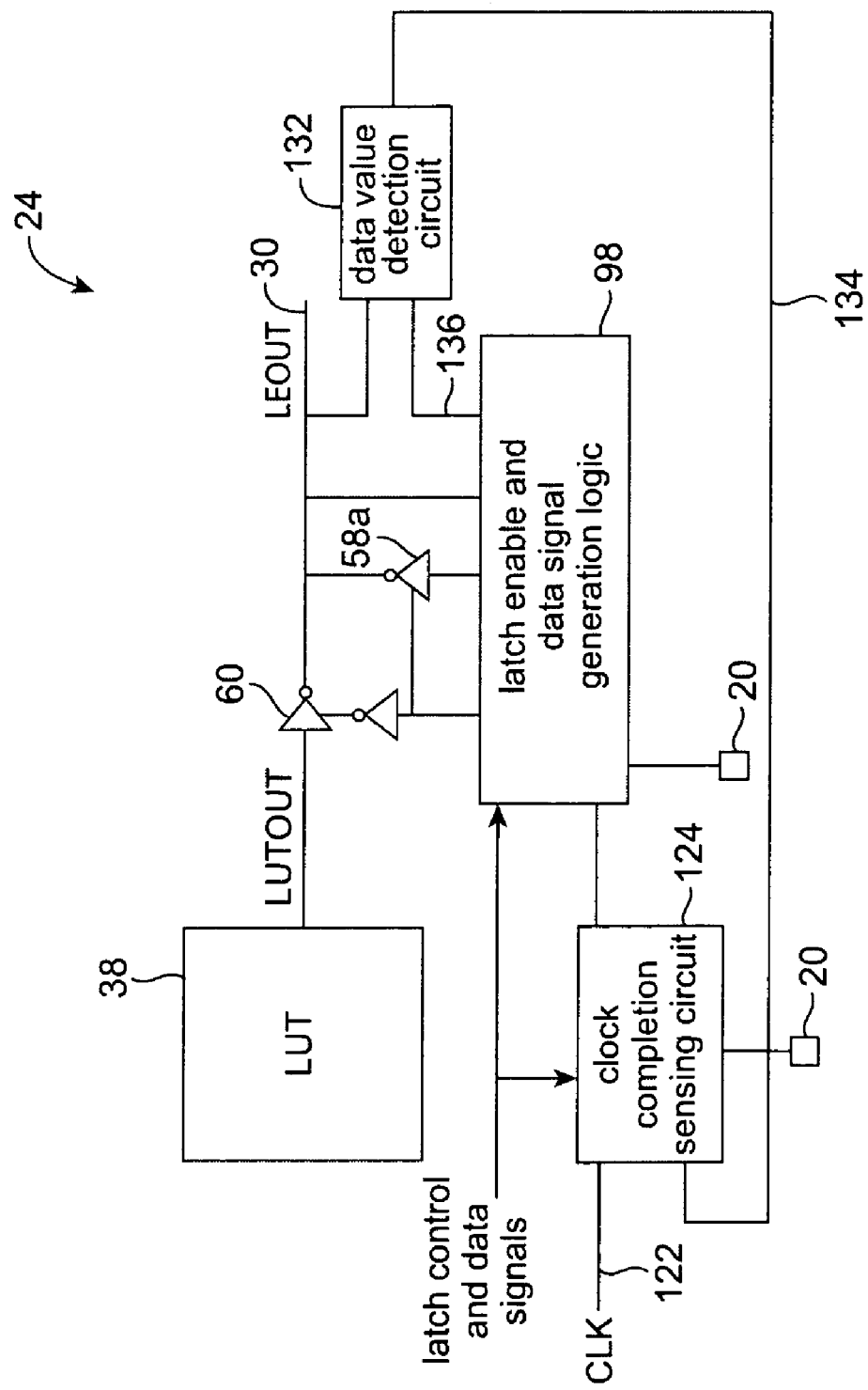
FIG. 21 is a generalized circuit diagram showing how a data-value-sensing arrangement may be used to control a latch in a programmable logic region in accordance with the present invention.
Figure 22:
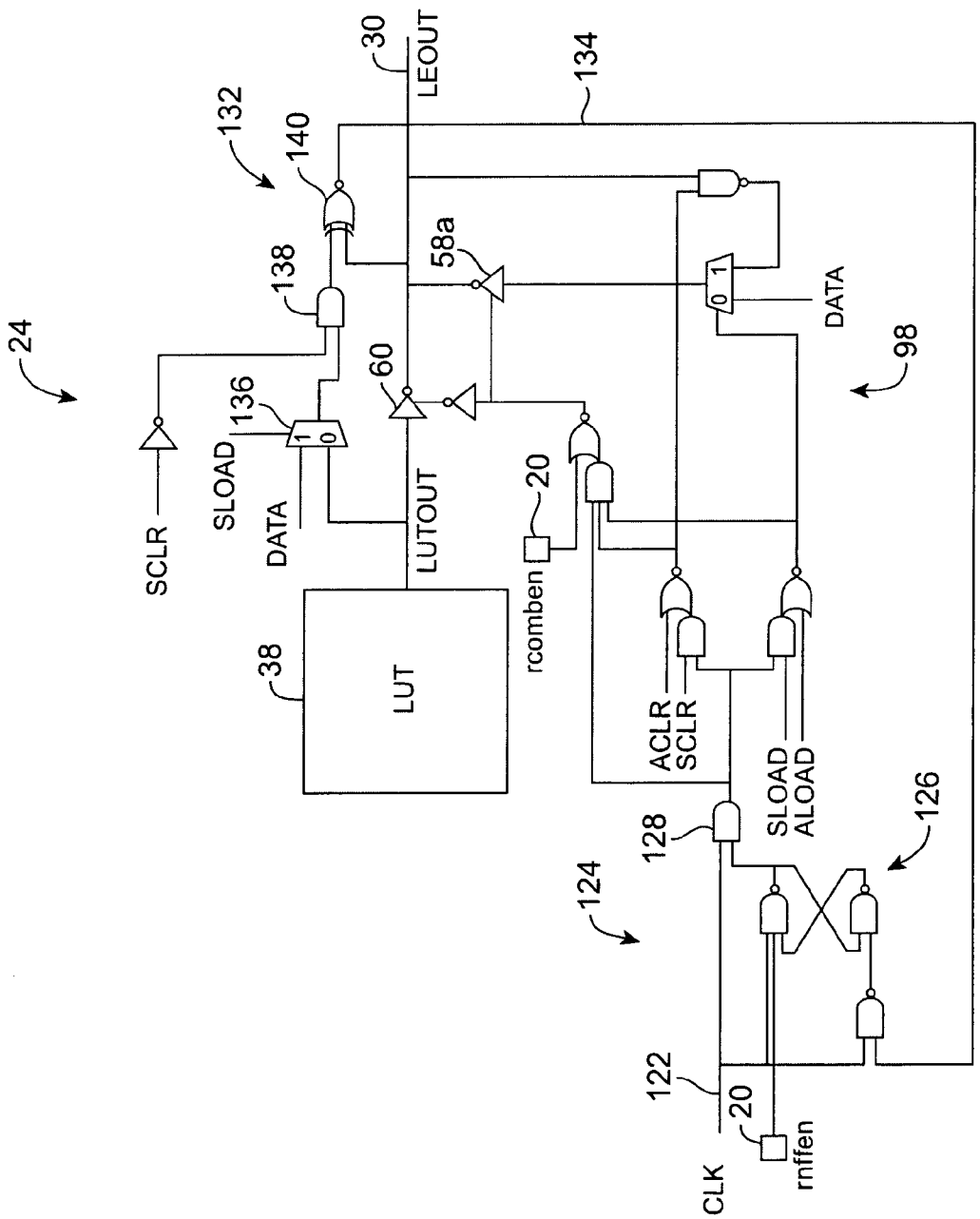
FIG. 22 is a circuit diagram of an illustrative programmable logic region with a data-value sensing arrangement for controlling latch circuitry in accordance with the present invention.

Another illustrative self-timed circuit arrangement is shown in FIGS. 21 and 22. A generalized circuit structure is given in FIG. 21. An illustrative detailed circuit implementation of the circuit of FIG. 21 is provided in FIG. 22. With this arrangement, the circuit detects that the correct data value has been latched.

In the illustrative arrangement of FIG. 21, a data value detection circuit 132 and feedback path 134 are used to determine whether or not it is safe to remove the clock, instead of using feedback path 130 (FIG. 20) to detect assertion of the latch enable signal.

The circuit of FIG. 21 compares the data present on LEOUT line 30 to a logic value that represents the logic value that should be loading into the latch (provided by logic 98 on line 136). This produces a logic signal on feedback line 134 when the data that it is intended to latch is the same as the data present on the LEOUT line 30. The logic signal on line 134 will cause the clock pulse to be negated by circuit 124. This provides further independence from process, voltage, and temperature variations, because the clock pulse is only negated when the correct data is detected as having been latched.

A detailed circuit implementation of the arrangement of FIG. 21 is shown in FIG. 22. The clock enable latch 126 is set when the clock is low. The clock enable latch 126 is cleared when the clock is high and the data output of the latch is the same as the LUTOUT data value. Data value detection circuit 132, which includes multiplexer 136, AND gate 138, and XNOR gate 140, compares the LEOUT data value on line 30 to the value that should be latched and generates a logical high value (a one) when the correct value is present on the LEOUT line 30.

Because this circuitry senses the successful latching of the data value it is not necessary to take into account minimum delay design considerations. It will, however, generally be desirable to minimize the propagation delay from when the data value is sensed as having been correctly latched to when the tri-state enable is negated to eliminate the possibility of race-through conditions. Accordingly, the self-timed circuit is preferably configured to propagate the assertion edge of the data completion circuit to the negation of the tri-state enable as quickly as possible. The circuit shown in FIG. 21 is merely illustrative. Any suitable logic circuit may be used to provide the capabilities of the FIG. 21 circuitry if desired.

The pulse-triggered latch circuits of FIGS. 17 and 18 and FIGS. 19 and 20 eliminate added delay from flip-flop setup and clock-to-output times by replacing a flip-flop with a level-sensitive latch implemented using a zero-delay latch structure of the type described in connection with FIG. 11. The pulse-triggered latch circuits of FIGS. 21 and 22 do not eliminate setup time delays, because the LUT output data LUTOUT must be stable before CLK arrives at the input 122 to the logic region 24 and until the CLK subsequently asserts the tri-state enable of the LUTOUT buffer 60.

The foregoing is merely illustrative of the principles of this invention and various modifications can be made by those skilled in the art without departing from the scope and spirit of the invention.

What is claimed is:

1. A programmable logic region on a programmable logic device, comprising:
    combinational logic that provides an output data value on a combinational logic output line;
    a logic region output line through which data from the logic region is routed to logic on the programmable logic device; and
    a zero-delay latch circuit connected between the combinational logic output line and the logic region output line that is selectively configured to serve as either a level-sensitive latch having an output that tracks the output data value when enabled or a zero-delay path that does not delay the output data value traveling from the combinational logic output line to the logic region output line, wherein the zero-delay latch circuit comprises a tri-state output driver having an input connected to the combinational logic output line and having an output connected to the logic region output line.

2. The programmable logic region defined in claim 1 wherein the combinational logic comprises a look-up table.

3. The programmable logic region defined in claim 1 wherein the zero-delay latch circuit comprises:
    at least one additional tri-state driver having its output connected to the logic region output line and forming part of a feedback loop from the logic region output line; and
    control logic responsive to control signals, wherein the control logic is connected between the logic region output line and the additional tri-state driver to form the feedback loop.

4. The programmable logic region defined in claim 3 wherein the control logic comprises logic circuitry responsive to a clear signal to clear the zero-delay latch circuit.

5. The programmable logic region defined in claim 1 wherein the tri-state output driver has at least one control input and wherein the zero-delay latch circuit comprises:
    control logic responsive to control signals, wherein the control logic is connected to the tri-state output driver control input for enabling or disabling the tri-state output driver.

6. A method of using a zero-delay latch structure in a programmable logic region on a programmable logic device integrated circuit, wherein the programmable logic region has combinational logic that produces combinational logic data at its output, a logic region output line though which the combinational logic data is provided to logic on the programmable logic device integrated circuit, and zero-delay latch circuitry, the method comprising:
    generating the combinational logic output data with the combinational logic;
    using an output driver to drive the combinational logic output data onto the logic region output line while directing the zero-delay latch circuitry to store the combinational logic output data; and
    disabling the output driver while using the zero-delay latch circuitry to maintain the stored combinational logic output data on the logic region output line.

7. The method defined in claim 6 wherein the output driver is a tri-state output driver having at least one control input and wherein disabling the output driver comprises applying a control signal to the control input.

8. The method defined in claim 6 wherein the zero-delay latch circuitry comprises a tri-state driver that forms at least part of a feedback loop, the method further comprising using the feedback loop to store the combinational logic output data.

9. The method defined in claim 6 wherein the zero-delay latch circuitry comprises at least one tri-state driver and an additional gate, the method further comprising using the tri-state driver and additional gate to store the combinational logic output data.

10. Circuitry connected between a combinational logic output line and a logic region output line on a programmable logic device, comprising:
    a zero-delay latch circuit that is selectively configured to serve as a zero-delay level sensitive latch that, in response to at least one control signal, either tracks combinational logic output data on the combinational logic output line or freezes its state to store the combinational logic output data; and
    additional circuitry that is connected to the zero-delay latch circuit so that the additional circuitry and the zero-delay latch circuit are selectively configured to serve as a flip-flop that receives the combinational logic output data from the combinational logic output line and that provides the combinational logic output data to the logic region output line, wherein the zero-delay latch circuit and the additional circuitry comprise a flip-flop connected in parallel with a zero-delay latch.

11. Circuitry connected between a combinational logic output line and a logic region output line on a programmable logic device, comprising:
    a zero-delay latch circuit that is selectively configured to serve as a zero-delay level sensitive latch that, in response to at least one control signal, either tracks combinational logic output data on the combinational logic output line or freezes its state to store the combinational logic output data; and
    additional circuitry that is connected to the zero-delay latch circuit so that the additional circuitry and the zero-delay latch circuit are selectively configured to serve as a flip-flop that receives the combinational logic output data from the combinational logic output line and that provides the combinational logic output data to the logic region output line, wherein the zero-delay latch circuit and the additional circuitry comprise pulse generation circuitry that generates a pulse that causes the combinational logic output data to be driven onto the logic region output line and which is narrow enough to avoid a race condition in which the combinational logic output data propagates through two latches and wherein the pulse generation circuitry comprises:
- a delay line that delays a clock signal applied to the zero delay latch circuit to produce a delayed clock signal; and
- logic circuitry that combines the clock signal and the delayed clock signal to produce the pulse.

12. Circuitry connected between a combinational logic output line and a logic region output line on a programmable logic device, comprising:
- a zero-delay latch circuit that is selectively configured to serve as a zero-delay level sensitive latch that, in response to at least one control signal, either tracks combinational logic output data on the combinational logic output line or freezes its state to store the combinational logic output data; and
- additional circuitry that is connected to the zero-delay latch circuit so that the additional circuitry and the zero-delay latch circuit are selectively configured to serve as a flip-flop that receives the combinational logic output data from the combinational logic output line and that provides the combinational logic output data to the logic region output line, wherein the zero-delay latch circuit and the additional circuitry comprise pulse generation circuitry that generates a pulse that causes the combinational logic output data to be driven onto the logic region output line and which is narrow enough to avoid a race condition in which the combinational logic output data propagates through two latches and wherein the pulse generation circuitry comprises a clock-completion sensing circuit.

13. Circuitry connected between a combinational logic output line and a logic region output line on a programmable logic device, comprising:
- a zero-delay latch circuit that is selectively configured to serve as a zero-delay level sensitive latch that, in response to at least one control signal, either tracks combinational logic output data on the combinational logic output line or freezes its state to store the combinational logic output data; and
- additional circuitry that is connected to the zero-delay latch circuit so that the additional circuitry and the zero-delay latch circuit are selectively configured to serve as a flip-flop that receives the combinational logic output data from the combinational logic output line and that provides the combinational logic output data to the logic region output line, wherein the zero-delay latch circuit and the additional circuitry comprise pulse generation circuitry that generates a pulse that causes the combinational logic output data to be driven onto the logic region output line and which is narrow enough to avoid a race condition in which the combinational logic output data propagates through two latches and wherein the pulse generation circuit comprises a data value detection circuit.

14. Circuitry connected between a combinational logic output line and a logic region output line on a programmable logic device, comprising:
- a zero-delay latch circuit that is selectively configured to serve as a zero-delay level sensitive latch that, in response to at least one control signal, either tracks combinational logic output data on the combinational logic output line or freezes its state to store the combinational logic output data; and
- additional circuitry that is connected to the zero-delay latch circuit so that the additional circuitry and the zero-delay latch circuit are selectively configured to serve as a flip-flop that receives the combinational logic output data from the combinational logic output line and that provides the combinational logic output data to the logic region output line, wherein the zero-delay latch circuit and the additional circuitry comprise pulse generation circuitry that generates a pulse that causes the combinational logic output data to be driven onto the logic region output line and which is narrow enough to avoid a race condition in which the combinational logic output data propagates through two latches and wherein the pulse generation circuit comprises a data value detection circuit that monitors successful latching of the combinational logic output data by the zero-delay latch circuit.

15. Latch circuitry connected between a combinational logic output line and a logic region output line, comprising:
- a first tri-state output driver having its input connected to the combinational logic output line, having its output connected to the logic region output, and having at least one control input;
- a second tri-state driver having its output connected to the logic region output line and having an input and at least one control input; and
- control logic having an input connected to the logic region output line, having a first output connected to the input of the second tri-state driver to form a feedback loop for data from the logic region output line, and having a second output that produces control signals that are provided to the control input of the first tri-state driver and the control input of the second-tri-state driver, wherein the control logic receives signals on at least one input and wherein the control logic generates the control signals for the first and second tri-state drivers based on the received signals.

16. The latch circuitry defined in claim 15 wherein the control logic comprises logic gates that receive clear and load control signals via the at least one input, wherein the control logic is configured to generate the control signal for the first and second tri-state drivers based at least partly on the clear and load control signals.

17. The latch circuitry defined in claim 15, wherein the combinational logic output line is connected to programmable combinational logic, wherein the programmable logic device has at least one programmable element that is configured using configuration data and that supplies a static control signal, wherein the control logic receives the static control signal, and wherein the control logic disables the latch circuitry when the static control signal has a first value and enables the latch circuitry to perform the functions of a level-sensitive latch when the static control signal has a second value.

* * * * *